(12) United States Patent
Ishiyama

(10) Patent No.: US 6,397,362 B1
(45) Date of Patent: May 28, 2002

(54) FAULT DIAGNOSIS METHOD AND SYSTEM FOR A SEQUENTIAL CIRCUIT

(75) Inventor: Toshio Ishiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/362,856

(22) Filed: Jul. 29, 1999

Related U.S. Application Data

(63) Continuation-in-part of application No. 09/158,356, filed on Sep. 23, 1998, now abandoned.

(30) Foreign Application Priority Data

Sep. 24, 1997 (JP) .............................. 9-258010
Jul. 29, 1998 (JP) ........................... 10-213359

(51) Int. Cl.⁷ .............................................. G01R 31/28
(52) U.S. Cl. ...................................... 714/724; 714/736
(58) Field of Search ................................. 714/724, 727, 714/726, 728, 738, 736, 819, 741

(56) References Cited

U.S. PATENT DOCUMENTS

| | | | |
|---|---|---|---|
| 4,503,536 A | * 3/1985 | Panzer | 714/732 |
| 4,527,272 A | * 7/1985 | Reiney | 714/736 |
| 5,640,403 A | 6/1997 | Ishiyama | 371/26 |

FOREIGN PATENT DOCUMENTS

| | | |
|---|---|---|
| JP | 1-197675 | 8/1989 |
| JP | 2-1575 | 1/1990 |
| JP | 3-89179 | 4/1991 |
| JP | 3-179565 | 8/1991 |
| JP | 6-194416 | 7/1994 |
| JP | 8-94714 | 4/1996 |
| JP | 8-146093 | 6/1996 |

* cited by examiner

Primary Examiner—Christine T. Tu
(74) Attorney, Agent, or Firm—Foley & Lardner

(57) ABSTRACT

A faulty diagnosis method has the steps of consecutively extracting combinational circuits, tracing a failed path from a failed pin or failed output of a combinational circuit, inferring input vector based on the failed outputs, and tracing a preceding combinational circuit from the inferred failed input based on the input vector. When no path having inconsistency with other paths is found, the faulty position resides in the combinational circuit. Operating time for inferring a faulty position can be reduced.

36 Claims, 38 Drawing Sheets

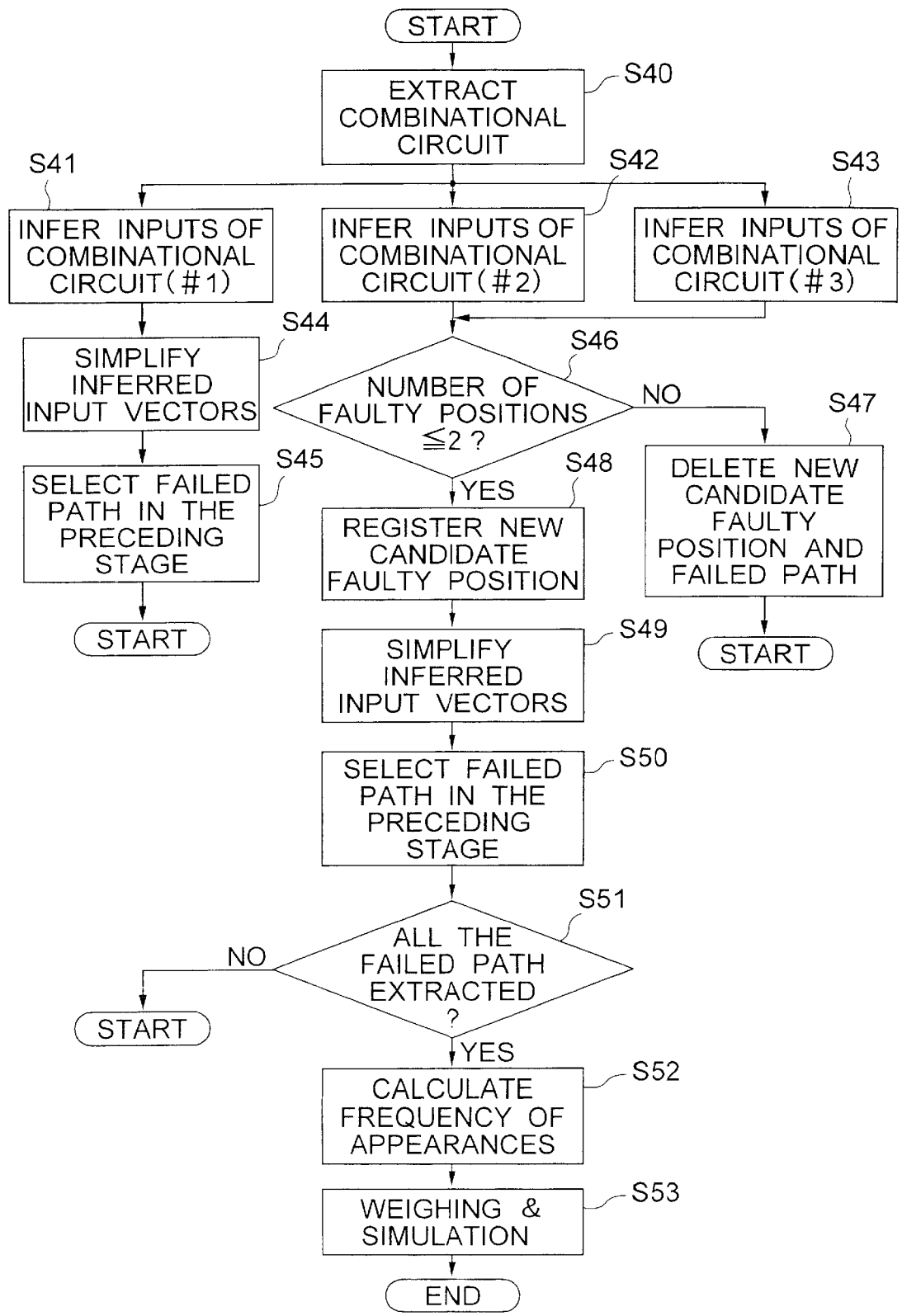

```
              FAIL 2              FAIL 1
FAIL 3          0      FAIL 3       0
FAIL 4          D      FAIL 4       Y
                0      FAIL 5       0
                Y      FAIL 6       D
                1                   1
                0                   0
                D                   D
                0                   D
                D                   D
                Q                   D
```

FAIL 1 : 8
FAIL 2 : 3
FAIL 3 : 3
FAIL 4 : 2
FAIL 5 : 2
FAIL 6 : 5

```
         FAIL 6              FAIL 1
FAIL 2    0        FAIL 2     0
FAIL 3    D        FAIL 3     Y
          0                   0
FAIL 5    D        FAIL 4     D
          1        FAIL 5     1
          0                   0
          D                   D
          0                   D
          D                   D
          D                   D
          Q                   D
```

FIG. 15

| PREVIOUS INFERENCE | PRESENT INFERENCE | JUDGEMENT |
|---|---|---|
| PATH | PATH | NO FAULT |
|  | PATH + ONE FAULTY POSITION | 0/1, OPEN, SHORT |
|  | PATH + TWO FAULTY POSITIONS | SHORT * |
| PATH + ONE FAULTY POSITION | PATH | 0/1, OPEN, SHORT |
|  | PATH + ONE FAULTY POSITION | (0/1, OPEN) SHORT * |
|  | PATH + TWO FAULTY POSITIONS | (SHORT)* |
| PATH + TWO FAULTY POSITIONS | PATH | SHORT * |
|  | PATH + ONE FAULTY POSITION | (SHORT)* |
|  | PATH + TWO FAULTY POSITIONS | (SHORT)* |

FIG. 16

| 0/1 STACKED FAILURE | SAME LOCATION & FIXED VALUE |
|---|---|
| OPEN FAILURE | SAME LOCATION |
| SHORT FAILURE | SAME LOCATION |

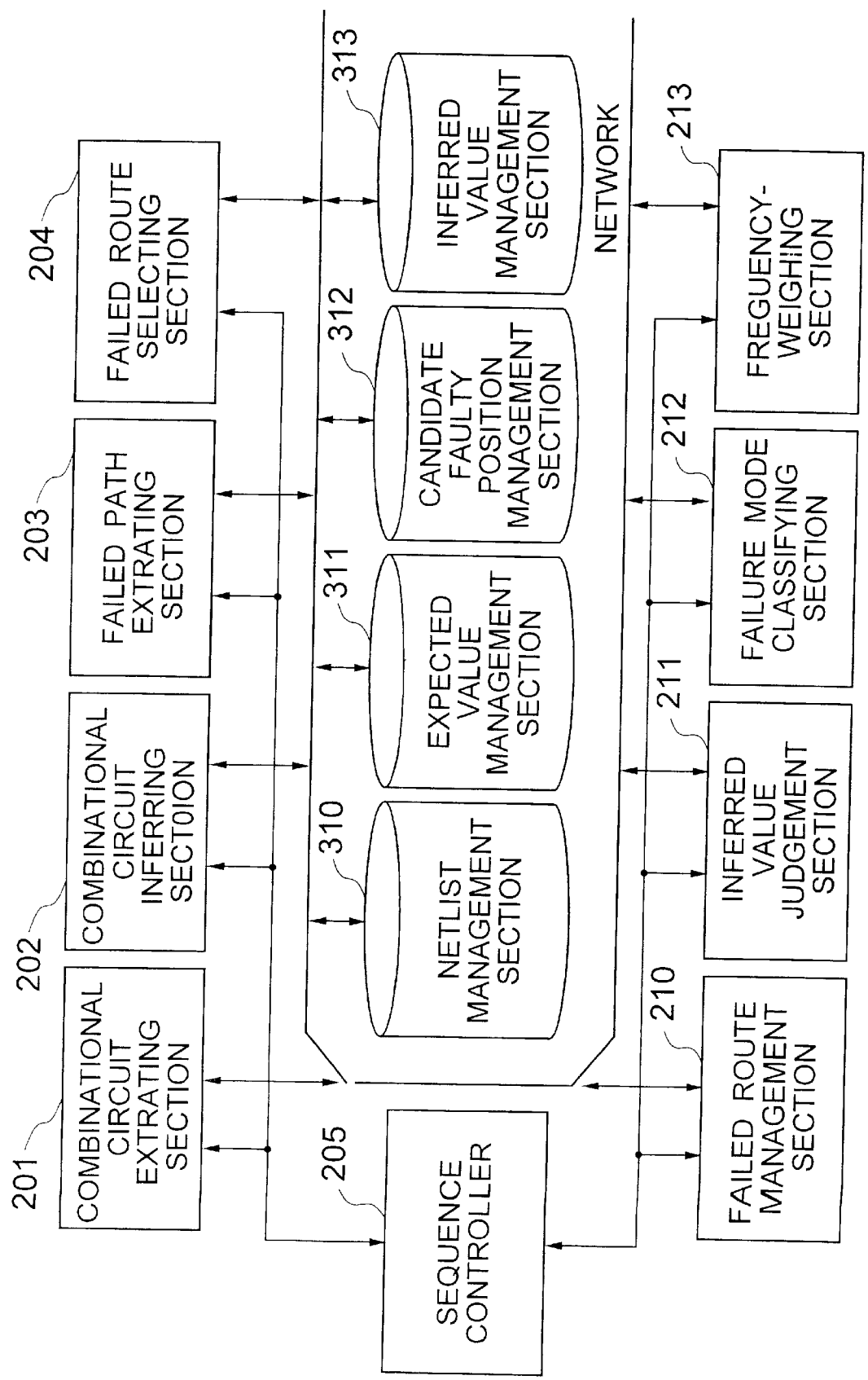

FAULT DIAGNOSIS METHOD AND SYSTEM FOR A SEQUENTIAL CIRCUIT

This is a continuation-in-at application of application Ser. No. 09/158,356 filed Oct. 23,1998, which is now to be abandoned.

BACKGROUND OF THE INVENTION (a) Field of the Invention

The present invention relates to fault diagnosis method and system for a sequential circuit and, more particularly, to a fault diagnosis method and system for localizing a faulty position in a LSI by inference.

(b) Description of the Related Art

A fault diagnosis technique of a LSI, especially for a sequential circuit, uses a fault diagnosis dictionary (hereinafter called simply "fault dictionary") to localize the faulty position by consulting the fault dictionary for examining the actual results of the failure, or uses a scanning path in the sequential circuit through which scanning flip-flops are written (set) and the output thereof are read out.

The method using the fault dictionary requires preparation of the fault dictionary by simulating a failure, wherein a fault is installed in a simulation of a LSI, and making data files for the fault dictionary wherein a faulty position and corresponding pass/fail information of each output pin of the LSI are tabulated. When an actual failure is found, the fault dictionary is consulted at the index thereof to infer the candidate faulty position based on the results of the pass/fail information on the output pins. If a plurality of candidate faulty positions are inferred, the plurality of candidate faulty positions are numbered for priority in a descending order of probability by using the inferred faulty positions obtained for all the test input vectors.

In the method using the fault dictionary, the fault dictionary must be prepared in advance, during which fault simulations must be performed for a prolonged period of time to make the fault dictionary to a sufficient level for practical use. Accordingly, the method has the problem in that the time length for the fault simulation is extremely large and the number of data files for the fault dictionary becomes also large as the scale of integration of an LSI increases.

Further, since the fault model used in the fault simulation is generally designed for a single stacked fault (stacked or fixed to "0" or "1" at any time) neglecting a failed floating level, the model does not correctly represent an actual operation in the case of a multiple-fault such as a short-circuit failure which involves two failed paths. If the model used in the fault simulation is upgraded to cope with such a multiple-fault, the method will be impractical, because the time length required for executing the fault simulation becomes excessively large.

The method using the scanning path technique requires that a test circuit be installed in the sequential circuit for writing/reading logical values (simply referred to as "values", hereinafter) to/from the sequential circuit through the test circuit. When a faulty position is to be inferred, the scanning flip-flops in the sequential circuit are set by using the test circuit, and the values thereof are read through the test circuit. By comparing the values thus read from the scanning flip-flops against the expected values to judge whether the fault resides in the subject combinational circuit or the failure is transferred from the preceding stage, the candidate faulty positions are excluded one by one to find the actual faulty position.

In the scanning path technique, there is a problem in that the technique cannot be applied to a LSI which has no such a scanning path for writing/reading information to/from flip-flops. In addition, in the case of a partial scanning path configuration, the circuit path disposed between the scanning flip-flops is not necessarily a combinational circuit, and thus the diagnosis for a sequential circuit must be also used. Further, if the fault dictionary is used in this diagnosis, the problems as mentioned above arise in the diagnosis.

JP-A-8-146093 proposes a fault diagnosis method for a LSI by consecutively extracting combinational circuits which are inferred to transfer a failure, and inferring the values for the inputs of the combinational circuits based on the actual outputs thereof while inferring the failed paths therein, so as to obtain the inferred input vectors of the combinational circuits.

In the method proposed by JP-A-8-146093, if a failed signal due to a faulty combinational circuit is fed back to the faulty combinational circuit itself through a plurality of other combinational circuits, incorrect values for the inputs of the faulty combinational circuit may be inferred, resulting in an incorrect inference that the failure is transferred from another correct input of the faulty combinational circuit to thereby degrade the accuracy of the inference.

In addition, the inference of the values for the inputs of the combinational circuit based on the outputs thereof requires all the inferred input vectors to be registered in an inference table, and is applied to a large number of combinational circuits extracted by the backward tracing of the LSI. Thus the inference requires a large time length for the diagnosis of the faulty position as the scale of the LSI increases.

SUMMARY OF THE INVENTION

It is therefore an object of the present invention to provide a fault diagnosis method for a sequential circuit in a LSI by using a pass/fail information of output pins in an actual test, a netlist in the LSI including connection information, expected values of outputs of flip-flops in the LSI for each input vector of the flip-flops.

The present invention provides, in a first aspect of thereof, a fault diagnosis method for a sequential circuit including the steps of obtaining information of expected values for outputs of s each flip-flop in the LSI based on each input vector of the each flip-flop, pass/fail information for each output pin in a test, and a netlist for the LSI;

consecutively extracting, based on the netlist, combinational circuits each having a plurality of inputs each connected to an input pin or an output of any flip-flop and a plurality of outputs each connected to an output pin or input of any flip-flop, the combinational circuit including nets and logic elements other than a flip-flop, wherein the tracing starts from a failed output pin by backward tracing to an output of any first flip-flop or an input pin, and the tracing includes forward tracing from an input pin or an output of any flip-flop found by backward tracing to an output pin or an input of any flip-flop and backward tracing from an output pin or input of any flip-flop found by forward tracing to an input pin or an output of any flip-flop;

inferring a plurality of input vectors for the inputs of each combinational circuit based on an output vector of the each combinational circuit or the pass/fail information, the output vector being inferred based on the pass/fail information;

reducing the input vectors of the combinational circuit in number by simplification so as to form the output vector of preceding combinational circuit; and inferring a faulty position in one of the combinational circuits when no correct input vector is inferred based on the output vector of the one of the combinational circuits, the correct input vector coinciding with an expected input vector of inputs of the one of the combinational circuits.

In accordance with the faulty diagnosis method of the first aspect of the present invention, by inferring the input vectors of the combinational circuit based on the output thereof and simplifying the inferred input vectors, the faulty position in a combinational circuit can be detected with a reduced time for diagnosis operation even in the case of a feed-back loop including the combinational circuit having the faulty position.

The present invention also provides, in a second aspect thereof, fault diagnosis method for a LSI including the steps of:

obtaining information of expected values for outputs of each flip-flop in the LSI based on each input vector of the each flip-flop, pass/fail information for each output pin in a test, and a netlist for the LSI;

consecutively extracting, based on the netlist, combinational circuits each having a plurality of inputs each connected to an input pin or an output of any flip-flop and a plurality of outputs each connected to an output pin or input of any flip-flop, the combinational circuit including nets and logic elements other than a flip-flop, wherein the tracing starts from a failed output pin by backward tracing to an output of any first flip-flop or an input pin, and the tracing includes forward tracing from an input pin or an output of any flip-flop found by backward tracing to an output pin or an input of any flip-flop and backward tracing from an output pin or input of any flip-flop found by forward tracing to an input pin or an output of any flip-flop;

inferring failed paths traced from the failed output in each extracted combinational circuit as inferred failed paths and primary candidate faulty positions from which at least one candidate faulty position is selected;

tracing a plurality of the inferred failed paths to draw an inferred failed route from the failed output to the candidate faulty position passing a plurality of the extracted combinational circuits;

calculating frequency for each candidate faulty position based on the failed output pins;

weighing the candidate faulty positions by the frequency; and selecting at least one of the candidate faulty positions having higher frequency than the others of the candidate faulty positions as a selected faulty position.

In accordance with the second aspect of the present invention, weighing the candidate faulty positions can reduce the workload and processing time of the inference of the faulty position.

Further, the consecutive extraction of the combinational circuits transferring the failure and inference of the input vectors thereof enables an efficient diagnosis without iterative inference of the same combinational circuit even in a larger scale LSI.

Furthermore, the faulty diagnosis method of the present invention can be applied to detect a multiple-fault such as a short-circuit (bridge) failure or timing failure.

The above and other objects, features and advantages of the present invention will be more apparent from the following description, referring to the accompanying drawings.

BRIEF DESCRIPTION OF THE DRAWINGS

FIG. 10 is a flowchart of a fault diagnosis method according to a second embodiment of the present invention;

FIG. 15 is a table for tabulating states of the failure in the combinational circuits and the judgment of the kinds of the fault;

FIG. 16 is a table for tabulating kinds of the fault and the state of the failure;

FIG. 41 is a block diagram modified from the fautl diagnosis system of FIG. 40

PREFERRED EMBODIMENTS OF THE INVENTION

Figure 1:
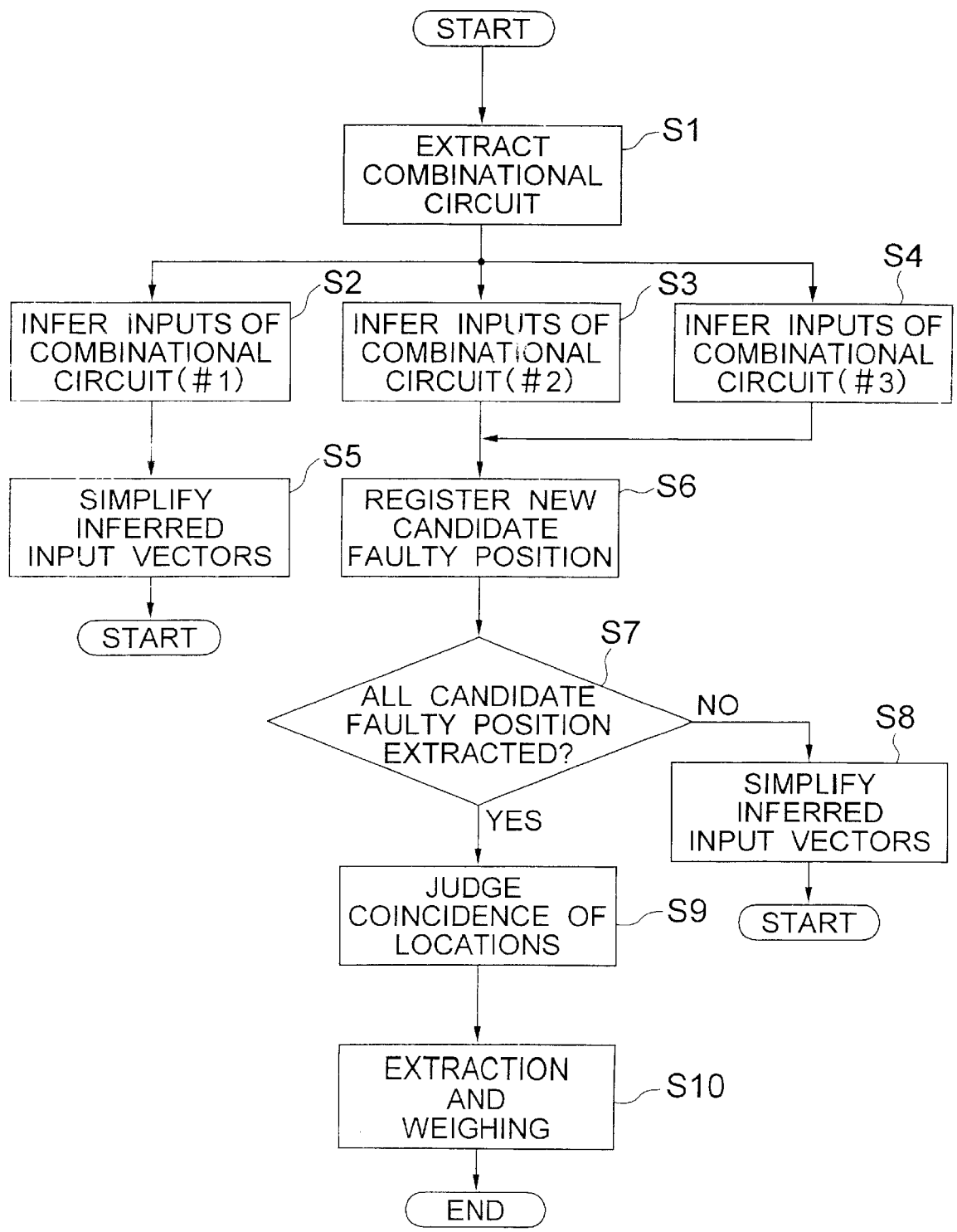
FIG. 1 is a flowchart of a fault diagnosis method according to a first embodiment of the present invention.

Now, the present invention is more specifically described with reference to accompanying drawings, wherein similar constituent elements are designated by similar reference numerals. First, the present invention is described in connection with the first aspect thereof.

Referring to FIG. 1, a fault diagnosis method for a combinational circuit according to a first embodiment of the present invention uses information of expected values for outputs of any flip-flops in the LSI obtained for all possible input vectors (or input patterns) of the flip-flops, pass/fail information for output pins in an actual test of the LSI by a tester, and a netlist including information of all nets (interconnects) in the LSI, which are prepared beforehand. The diagnosis operation is conducted by inference after separating the flip-flops and the combinational circuits.

In the configuration of the LSI as a whole, sequential circuits, such as a flip-flop or a memory cell, having a function for temporarily storing data are generally distinguished from combinational circuits which include no such elements having the function for temporarily storing data. The sequential circuit including a flip-flop generally delivers different output data if it receives the same input data with different timings of the input clock signal. On the other hand, the combinational circuit including no flip-flop delivers the same output data if it receives the same input data.

In step S1 of FIG. 1 for extracting a combinational circuit, backward tracing is first conducted from a failed output pin of the LSI, or a terminal of a flip-flop inferred as delivering a failed output, toward the input side of the LSI for extraction of a combinational circuit. If the backward tracing of any path from the failed output pin reaches or finds an input pin of the LSI or an output of any flip-flop therein, the backward tracing is finished. Then, forward tracing is conducted from the input pin or the outputs of any flip-flop thus found toward the output side of the LSI before finding another output pin of the LSI or an input of any flip-flop, thereby extracting a combinational circuit between the flip-flops found by the backward tracing and the forward tracing. Further, backward tracing and forward tracing are iteratively conducted between output pins of the LSI or inputs of any flip-flops and input pins of the LSI or outputs of any flip-flops, thereby extracting combinational circuits transferring the failure in the LSI.

The "tracing" as used herein means an operation for mere tracing along a path in the LSI based on the netlist, whereas "extracting" or "extraction" as used herein means an operation for finding a partial circuit in the LSI to extract the same as a part of the path traced thereby.

A plurality of different steps S2 to S4 follow step S1 depending on the inferences of the failed path or the number of faulty positions in the extracted combinational circuit. Step S2 corresponds to FIG. 2A, wherein it is inferred that a faulty position causing the failure on the outputs of an output latch circuit 102 succeeding the extracted combinational circuit 100 is not generated in the combinational circuit 100 and the failure transferred from an input latch circuit 101 preceding the extracted combinational circuit 100. Step S2 is to infer the input vector for the inputs of the latch circuit 101 based on the outputs of the latch 102, assuming that the faulty position is outside the combinational circuit 100.

Figure 2A:
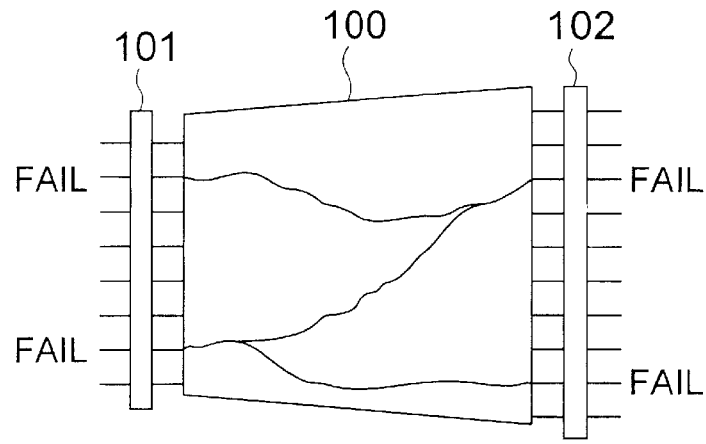
FIGS. 2A, 2B and 2C are schematic top plan views of a combinational circuit of a LSI for showing occurrence or transmission of a fault.
Figure 2B:
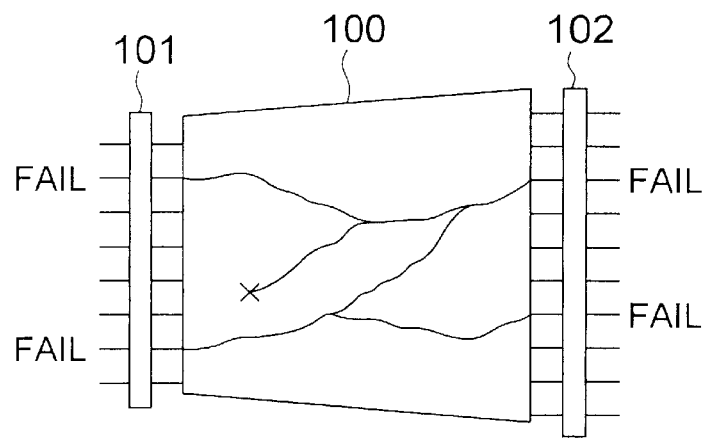
Figure 2C:
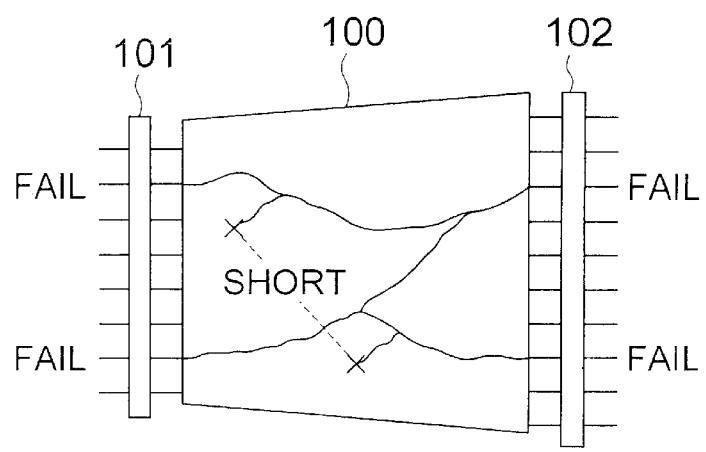

Steps S3 and S4 correspond to FIGS. 2B and 2C, respectively, wherein a single faulty position and two faulty positions, respectively, are assumed in the extracted combinational circuit 100. These steps S3 and S4 are to infer the input vectors for the inputs of the latch circuit 101 based on the outputs of the latch 102 as well as to localize the faulty position or positions in the combinational circuit 100.

Those steps S2 to S4 use a search tree technique, a binary decision diagram (BDD) or a transitive closure algorithm to infer the input vector which satisfies given outputs of the combinational circuit. For example, the search tree technique uses iterative assumption and implication to obtain the input vector based on the given outputs. More specifically, the input vector is inferred, starting from the failed output, by assuming the inputs of the gate satisfying the failed output, determining the value of the associated other gates and paths based on the assumption, and repeating these steps to obtain the values of the gates and paths consecutively toward the input side, the values being consistent with one another, thereby determining the possible input vector of the combinational circuit.

In step S2, failed paths transferring the failure in the combinational circuit are obtained by extracting only the case wherein values for all the paths can be assumed without inconsistency among the values before reaching the inputs of the combinational circuit 100 during tracing by using the assumptions and the implications from the failed output. If there is a case wherein at least a path has inconsistency with the other paths in the assumption before reaching the inputs of the combinational circuit, the case is discarded for further consideration.

In step S3, a specific case is extracted wherein there is only a single path present which has inconsistency with the assumption before reaching the inputs of the combinational circuit. A failed path or failed paths transferring the failure from a preceding stage and the single path (shown between "X" and a branch point in FIG. 2B) having such an inconsistency are extracted. Other case, if any, is discarded for further consideration.

In step S4, another specific case is extracted wherein there are only two paths present which have values inconsistent with the assumption before reaching the inputs of the combinational circuit. A failed path or failed paths transferring the failure and both the paths (shown between "X" and each branch point in FIG. 2C) having such inconsistencies are also extracted. Other case, if any, is discarded.

Figure 3:
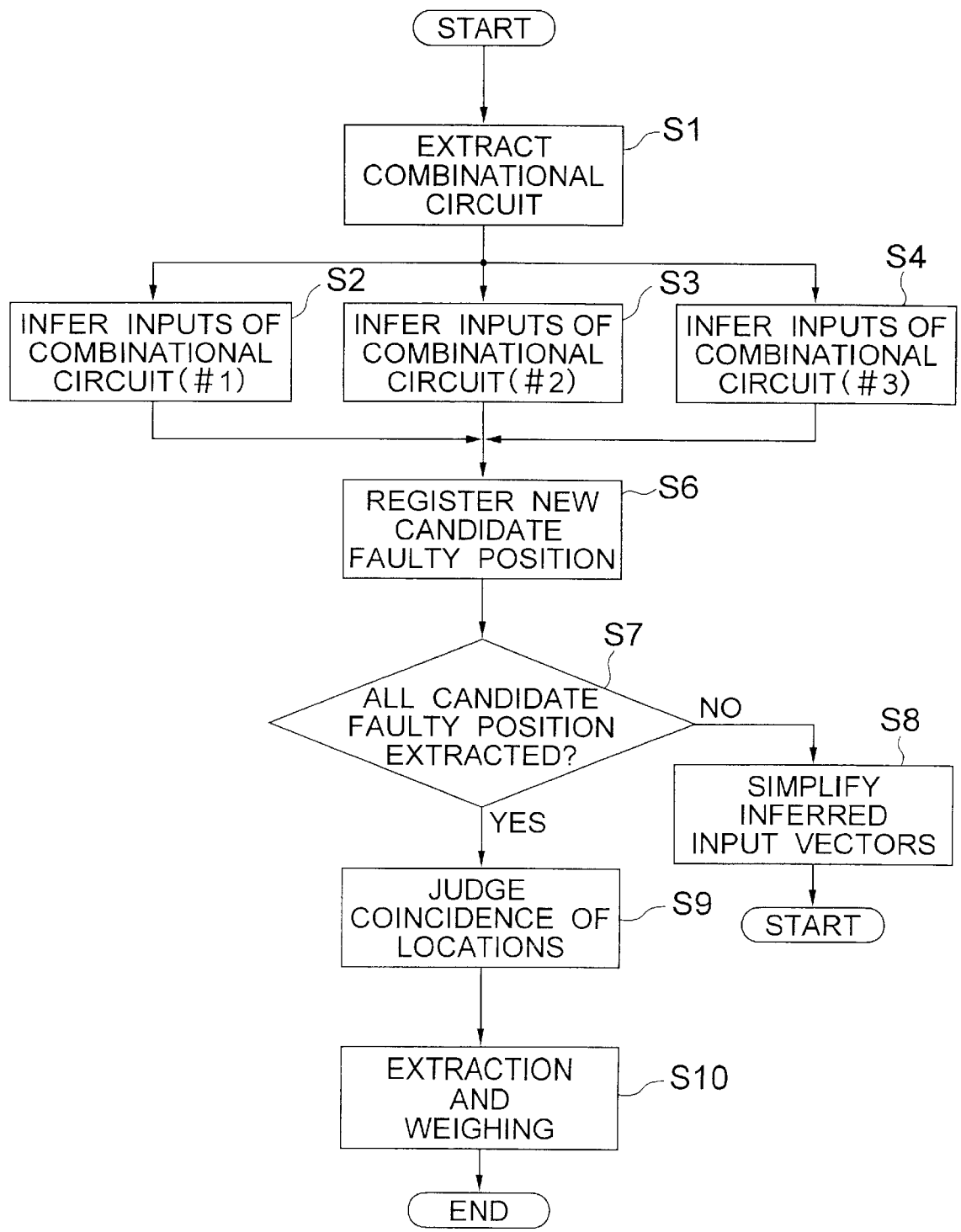
FIG. 3 is a flowchart of a faulty diagnosis method modified from the first embodiment.

If no path reaching the input side is found in those steps S2 to S4, the process eventually advances to step S7. In this respect, FIG. 1 may be modified to obtain the process shown in FIG. 3 wherein step S5 for simplification of input vectors is not conducted. After the inconsistent paths found by steps S3 and S4 are registered as new candidate faulty positions in step S6, the process advances to step S7, wherein it is examined that all the possible candidate faulty positions are extracted. If no such inconsistent path is found in steps S3 and S4, the register of the candidate faulty position is not conducted, thereby advancing to steps S7.

If a path or paths are found to the input side in steps S2 to S4, it means that the failure is transferred from the input side of the combinational circuit. In this case, since it can be judged that all the possible candidate faulty positions are not extracted in the LSI, the process advances to step S8 of formation and simplification of input vectors of the combinational circuit, followed by returning to step S1, wherein a preceding combinational circuit disposed at the input stage of the input latch circuit 101 is extracted based on the simplified input vectors. On the other hand, if no such path is found to the input side in steps S2 to S4, the tracing is finished, and another backward tracing is conducted from another failed output pin of the LSI, if any.

In a particular case in the steps S2 to S4, no inferred input vector of the combinational circuit is obtained, whereas only an inferred faulty position or two inferred faulty positions is obtained. This means that any input vector cannot provide the outputs of the combinational circuit, and therefore, it can be judged that the failure is not transferred from the preceding combinational circuit.

Figure 4:
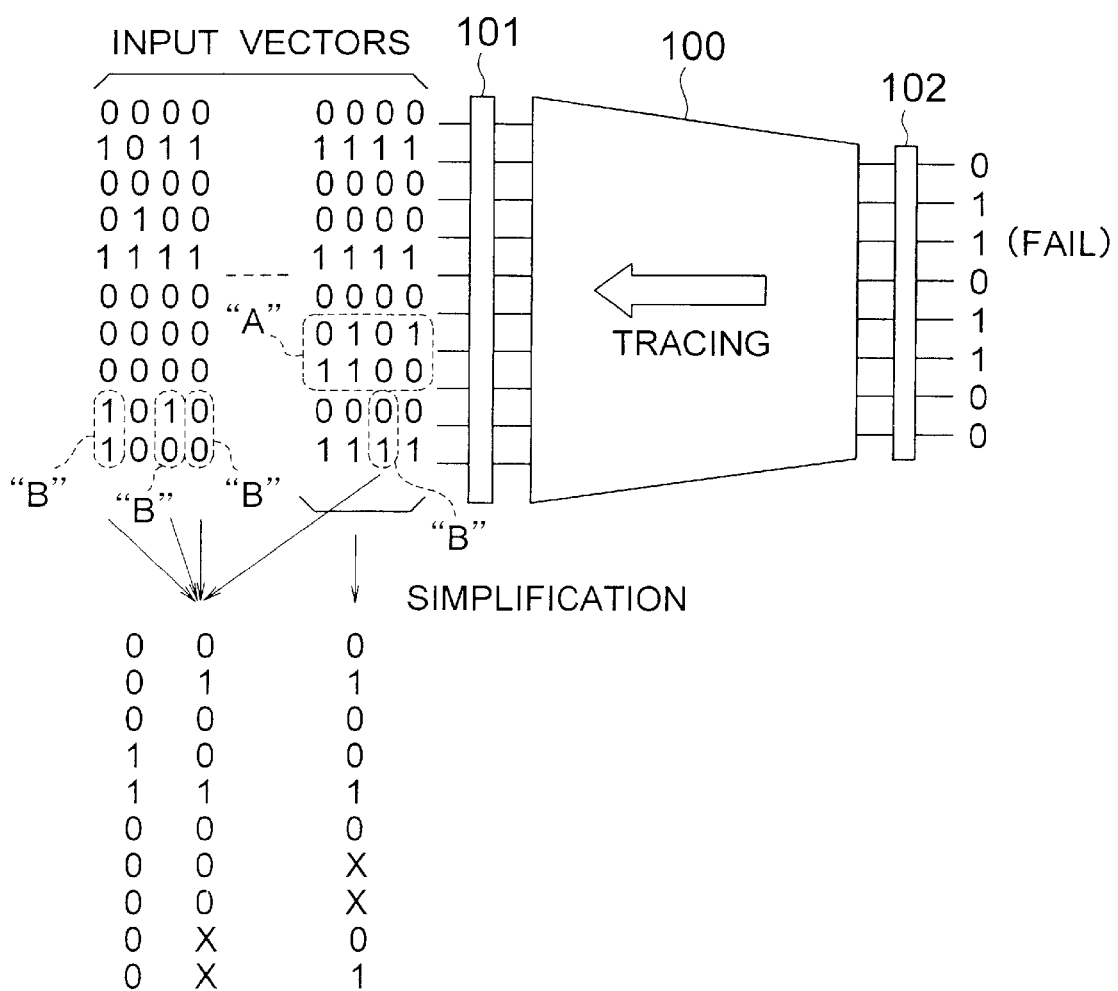
FIG. 4 is an explanatory view for showing simplification of inferred input vectors obtained based on the outputs of a combinational circuit.

A simplification formula generally used for the Boolean algebra is used in step S5 to reduce the number of inferred input vectors of the combinational circuit obtained by inference based on the outputs in step S2. Referring to FIG. 4, the number of input vectors are reduced by extracting particular inputs and the logical values thereof which do not affect the failed output of the combinational circuit 100. These values may be either "0" or "1" to provide the given outputs.

More specifically, the four inferred input vectors shown at the right columns in FIG. 4 coincide with one another except for the input vectors encircled by a closed dotted curve "A". These four input vectors (0100100101, 0100101101, 0100100001, 0100101001) are replaced by a single input vector (0100010xx01) shown at the bottom after the simplification thereof. In the replacement, if the number of input terminals corresponding to the encircled input vectors is one and the encircled input vectors include 0/1, then the values for the input terminal is substituted for "x" in the simplified input vector, whereas if the number of input terminals corresponding to the encircled input vectors is two and the encircled input vectors include all four patterns 00/01/10/11, as is the case of the right four columns in FIG. 4, then each of both the values for the input terminals is substituted for "x".

Similarly, since the input vectors shown at first, third and fourth columns and next to last column (as viewed from the left) coincide with one another except for the input vectors encircled by closed dotted curves "B", these four vectors (0100100011, 0100100010, 0100100000, 0100100001) are also replaced by a single input vector (01001000xx) shown at the bottom. The input vector shown at the second column (as viewed from the left) remains as it is after the simplification.

In the simplification procedure as described above, "x" in the simplified input vector shows that the failed output is not attributable to the corresponding input terminal. By the simplification procedure, the number of input vectors can be significantly reduced.

In step S6, the faulty positions inferred in steps S3 and S4 are registered as new candidate inferred faulty position, followed by step S7 wherein it is judged whether or not all the inferred faulty positions are extracted for all of the input vectors. If it is judged that all the inferred faulty positions are extracted for all of the input vectors and the failure is not transferred from the preceding stage, the process advances to step S9.

If the input terminals transferring therethrough the failure from the preceding combinational circuit cannot be obtained and yet the inference of all the possible input test vectors are not completed, steps S1 to S7 are iteratively conducted for such input test vectors.

If input terminals transferring therethrough the failure from a preceding stage are inferred, the inferred failed input vectors are subjected to simplification in step S8 to reduce the number of inferred input vectors and the failed input terminals are also extracted, then returning to step S1 for extraction of the preceding combinational circuit.

If it is judged in step S7 that the extraction of all the candidate faulty positions is completed, it is judged in step S9 whether the candidate faulty positions coincide with one another. In this judgement, the frequency of iterative appearances of a particular candidate faulty position is examined in the candidate faulty position table prepared in step S6, by detecting and comparing the locations, the gates and the paths of the candidate faulty positions.

Weighing the extracted candidate faulty positions is conducted in step S10 by counting the number (or frequency) of the appearances of each candidate faulty position to thereby prepare a faulty diagnosis list, wherein the faulty positions are sorted based on the frequency of the appearances, i.e., in a descending order of the frequencies. In this step, a general principle is considered that a true faulty position or a true failed path appears most frequently among the candidate faulty positions inferred. This results from the fact that the true faulty position will appear in the results of all the inferences based on the failed outputs of the combinational circuit in the event of any single stacked failure, open-circuit failure or short-circuit failure therein.

Figure 5:
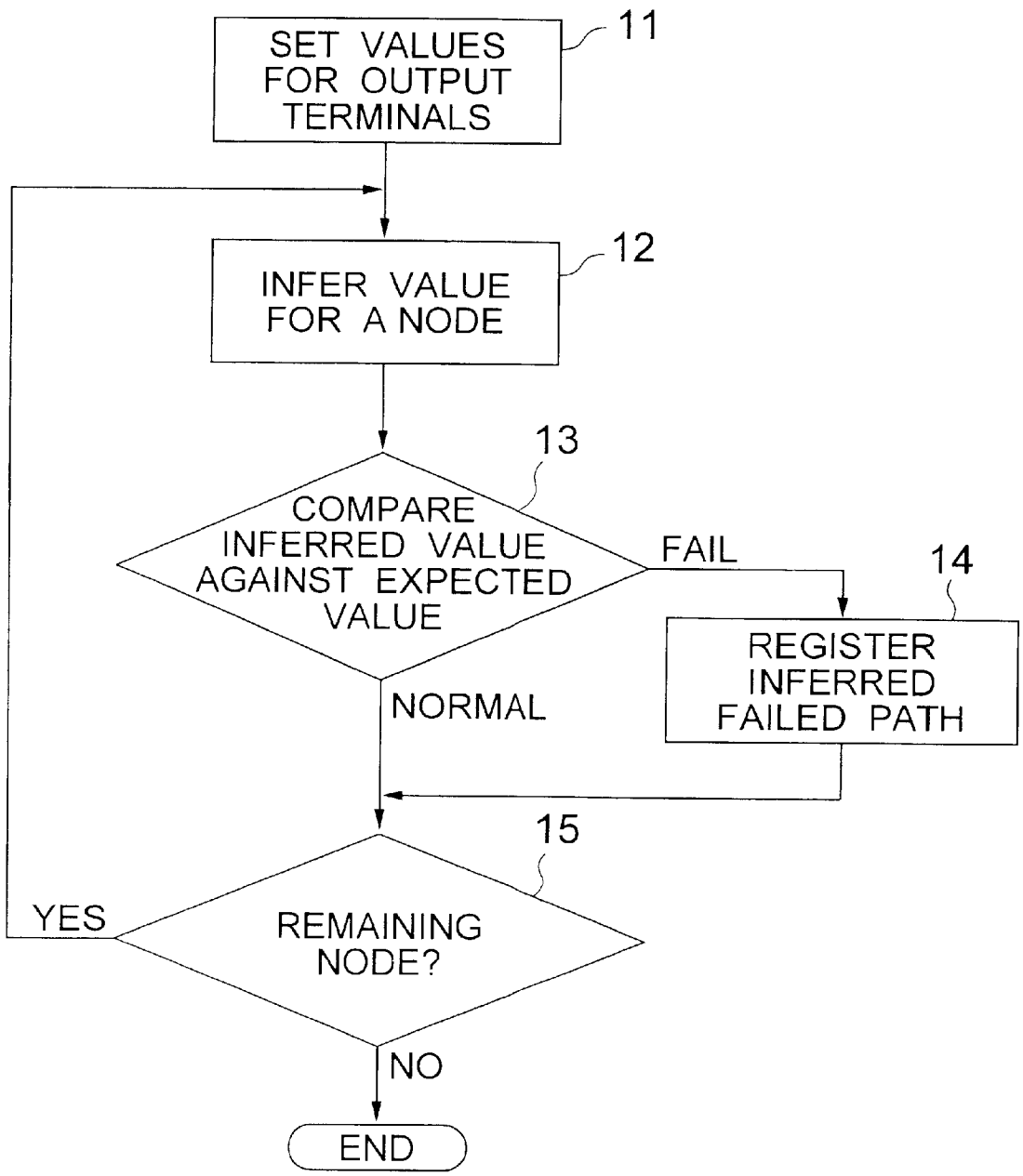
FIG. 5 is a flowchart of a process for extracting a failed path transferring a failure, where the subject combination circuit does not have a faulty position.
Figure 6:
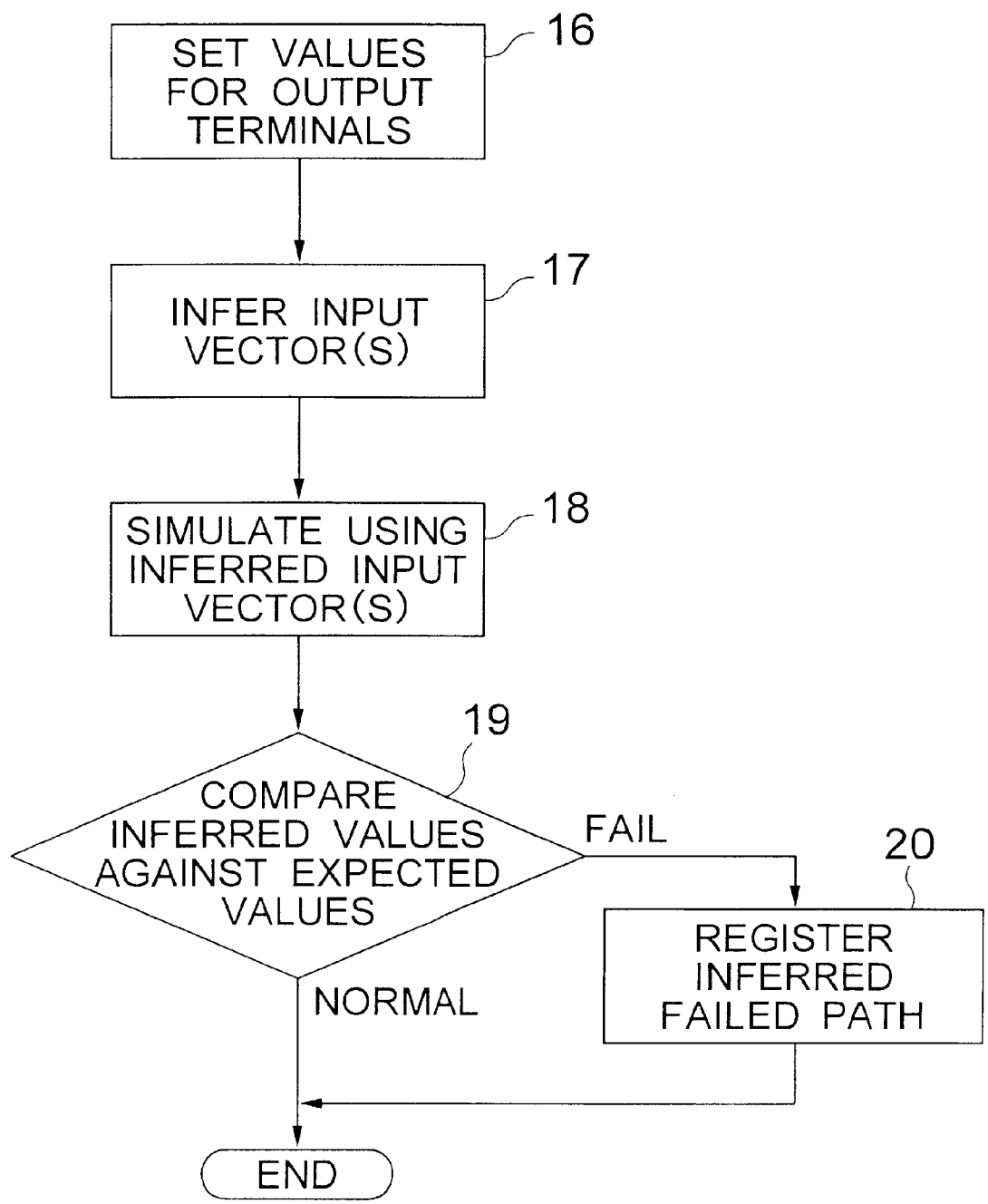
FIG. 6 is a flowchart of another process for extracting a failed path transferring a failure, where the subject combination circuit does not have a faulty position.
Figure 7:
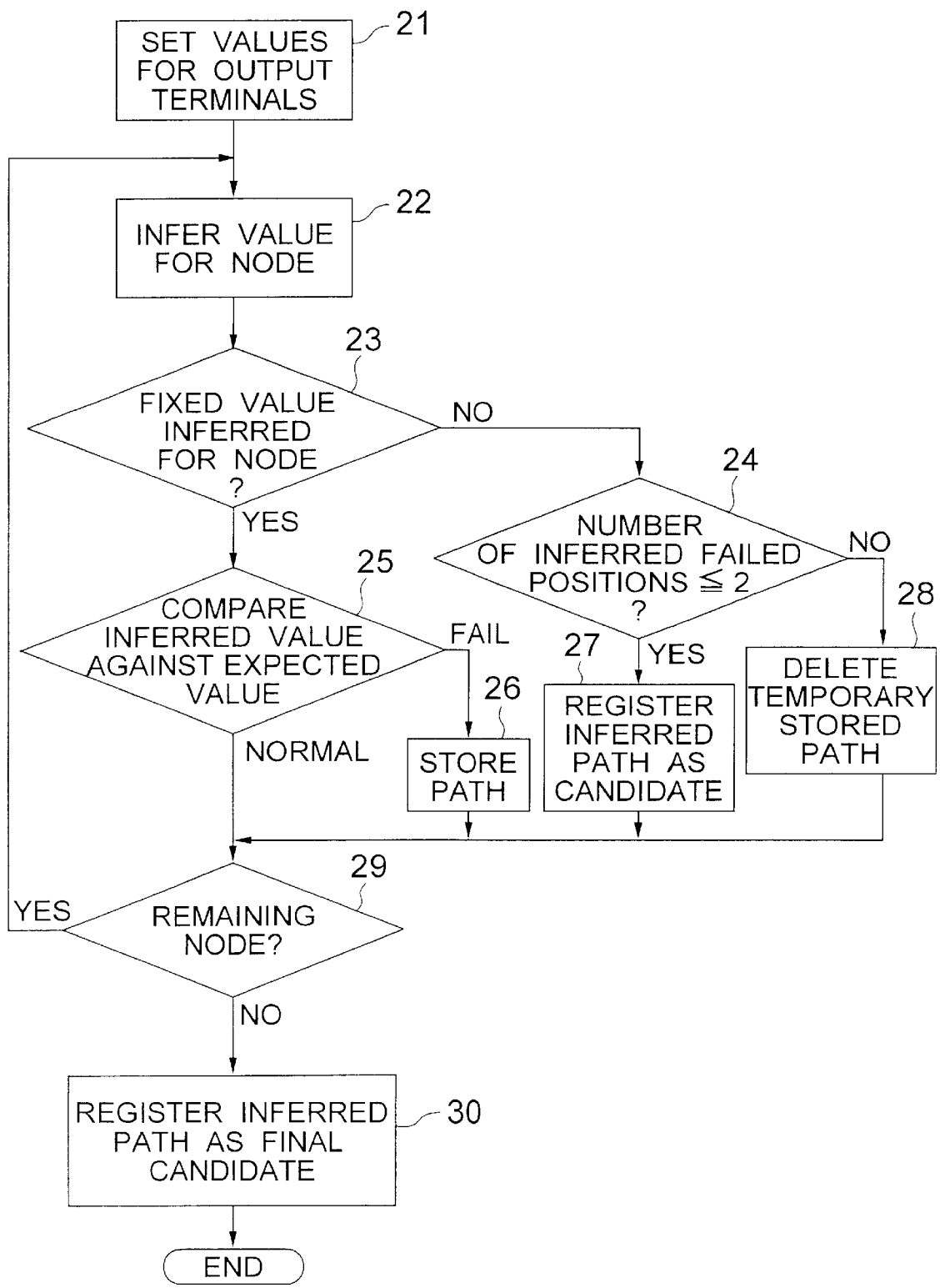
FIG. 7 is a flowchart of another process for extracting a failed path transferring a failure, where the subject combinational circuit has a faulty position.

FIGS. 5 to 7 show detailed procedures in steps S2 to S4, respectively, for inferring a faulty position in the combinational circuit and failed inputs or input vectors of the combinational circuit.

Referring to FIG. 5, there is shown a procedure of inferring failed paths and input vectors for the case of assumed absence of a faulty position in the subject combinational circuit. In step S11, values for all the output terminals are initially set in the combinational circuit. In this step, a failed value is set for the actually failed output pin or an inferred failed output which is obtained in a previous inference of a succeeding combinational circuit to transfer a failed value, whereas an expected value is set for a normal output or inferred normal output transferring a normal value. If there is an output terminal which is not identified as transferring a failed value or a normal value and therefore is not attributable to the failure, the output terminal is set at "X" which may be "0" or "1".

Subsequently, in step S12, a node is selected in the combinational circuit and its value is inferred based on the initial output vector set in step S11. In step S13, the inferred logical value is compared against the expected logical value. If there is a difference between the expected logical value and the inferred logical value, the node is registered as an inferred failed path in step S14. If the inferred logical value coincides with the expected logical value, another node is selected after backward tracing and its logical value is inferred and compared against the corresponding expected logical value for detecting a failed path. If it is judged in step S15 that the selection of nodes is completed, the procedure is ended.

By backward tracing of the inferred failed nodes toward the input side, failed paths in the combinational circuit as well as failed inputs thereof transferring the failure are extracted.

FIG. 6 shows an alternative procedure for inferring the failed path transferring the failure, wherein input vectors of the combinational circuit are inferred based on the initial output vector in step S17 following the initializing step S16 which is similar to step S11 of FIG. 5. In step S18, a logical simulation is conducted using the inferred input vectors to infer respective logical values. In step S19, by consecutively comparing the inferred logical values and the expected logical values, a failed path, if any, is registered in step S20 as an inferred failed path.

Figure 8:
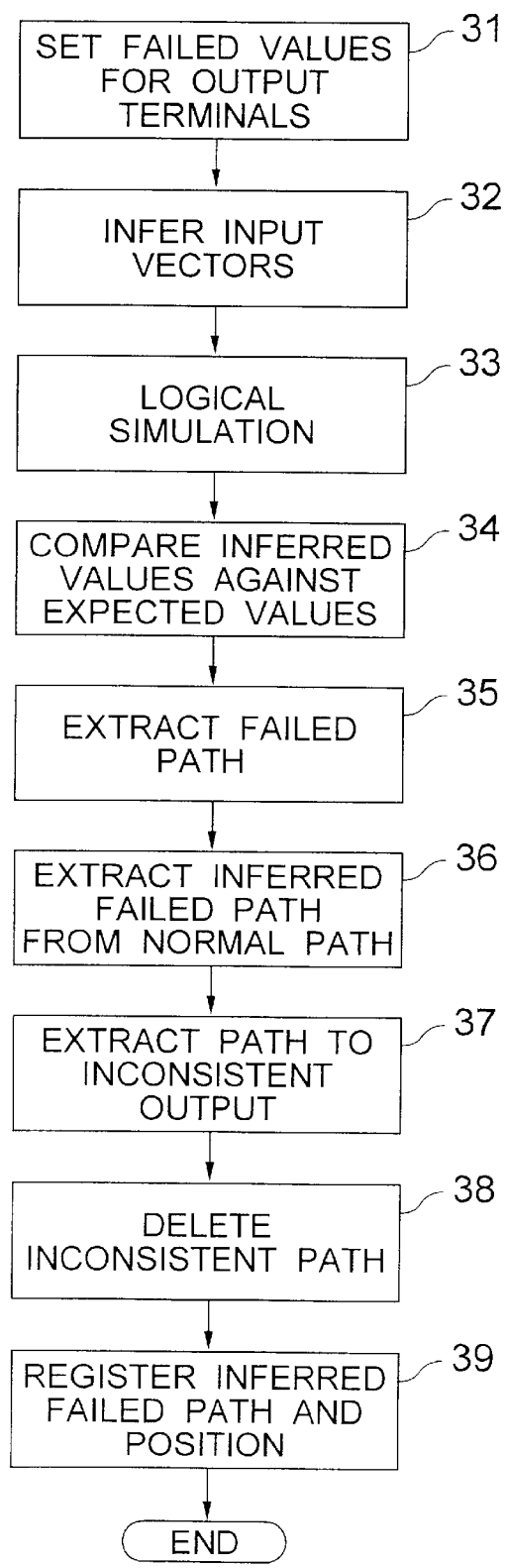
FIG. 8 is a flowchart of another process for extracting a failed path transferring a failure, where the subject combinational circuit has a faulty position.

Referring to FIGS. 7 and 8, there are shown flowcharts for a procedure for inferring a faulty position and a failed path transferring the failure in a combinational circuit in the case of the presence of a faulty position. FIG. 7 corresponds to FIG. 5 wherein input vectors are inferred together with faulty positions and failed paths, whereas FIG. 8 corresponds to FIG. 6 wherein a logic simulation is conducted after the input vectors are inferred.

In FIG. 7, output terminals of a combinational circuit are initially set in step S21 at the values which are inferred or identified beforehand based on the actual test result or an inferred result, similarly to steps S11 and S16. In other words, the values are set for output terminals irrespective of whether the values are failed or normal so long as the values are fixed (definite), whereas values are not set for output terminals having indefinite values. In step S22, the logical value for each node is inferred based on the initial output values similarly to steps S2 to S4.

Figure 9A:
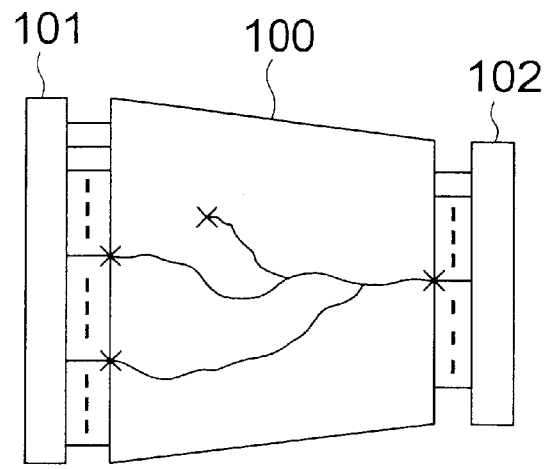
FIGS. 9A and 9B are schematic top plan views of a combinational circuit for showing transfer of failure, where the subject combinational circuit has a faulty position.

In step S23, it is examined whether or not a node has a definite (fixed) inferred value, and if a definite value is inferred in step S23, then process advances to step S25, whereas if a definite value is not inferred in step S23 then the process advances to step S24. In this procedure, if a definite value is not inferred for the node, it means that backward tracing cannot be conducted from the node and the inputs of the subject gate element to be inferred are determined by other nodes, thus resulting in a possibility wherein the values for the inputs satisfying the outputs cannot be obtained. In such a case, the inference of the failed path cannot lead to the inputs of the combinational circuit, which means the presence of the faulty position in the subject combinational circuit, as schematically illustrated at "X" in FIG. 9A.

If the logical values for input terminals can be inferred by consecutively inferring internal nodes from the failed output in the combinational circuit, the path tracing these inferred internal nodes is considered as an inferred failed path which transfers the failure. On the other hand, if the inference of internal nodes is stopped inside the combinational circuit and does not lead to an input terminal thereof, it means that a faulty position is inferred to reside in the subject combinational circuit. The inferred faulty position is herein referred to as a path portion between a branch point from an inferred failed path and the point (X) at which the tracing is stopped due to the inability of the inference.

If the logical value for a node can be inferred in step S23, the inferred value is compared against the corresponding expected value in step S25. If the inferred value is different from the expected value, the node is temporarily listed on a failed path list as a suspected failed path in step S26. This is because it cannot be determined at this stage whether the failure is transferred to the combinational circuit or generated therein, and can be determined later depending on whether or not an inferred value is obtained during the node inference.

If the node inference is not possible in step S23, it means that a faulty position resides in the combinational circuit. In this case, the sum of the number of registered positions inferred in previous step and the faulty position newly inferred in step S23 is examined to confirm that the number of the registered faulty positions in the combinational circuit is one or two.

If the number of inferred faulty positions in the combinational circuit exceeds two at this stage, the suspected failed path stored in step S26 is deleted and the corresponding values for the inputs of the combinational circuit inferred on the same condition as the suspected failed path are also discarded because the inference does not meet the actual fact. If the number of inferred faulty positions is two or less in step S24, the path stored in step S26 is registered as an inferred faulty position in step S27 because this case is probable.

If it is inferred that the failed output is attributable to an input of the combinational circuit or that the combinational circuit has a faulty position or two faulty positions after the racing of the nodes in the combinational circuit, the inference itself is regarded as correct, and the suspected failed path or paths stored in step S26, if any, are registered in step S30 as final candidate failed paths.

Figure 9B:
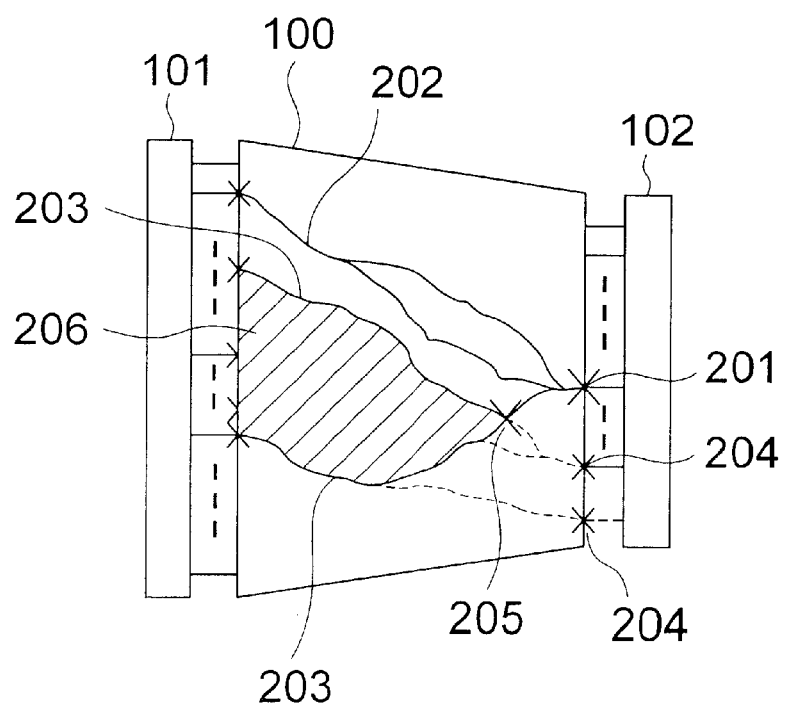

Referring to FIG. 8, a process using a logical simulation is illustrated corresponding to the situation shown in FIG. 9B, wherein input vectors satisfying the failed outputs 201 can be inferred. In this process, the inferred inputs vectors are used in a logical simulation to infer the failed paths which transfer the failure. By removing the paths 203 which lead to normal outputs 204 among the inferred failed paths, the remaining inferred failed paths 202 and a faulty position 205 are extracted. In the example of FIG. 9B, the paths 203 in the hatched portion 206 is removed as normal paths which lead to normal outputs 204.

In a practical procedure according to FIG. 8, inferred failed outputs among the outputs each having an inferred value or definite actual value are initially set as well as the logical values for the inferred failed outputs in step S31.

In step S32, the values for the inputs of the combinational circuit are inferred based on the initial values for the outputs. A logical simulation is then conducted in step S33 to infer values for internal nodes by using the inferred values for the inputs of the combinational circuit obtained in step S32. In step S34, the inferred logical values obtained by the logical simulation are compared against the expected logical values to extract all the failed paths transferring the failure from the inputs to the outputs of the combinational circuit in step S35.

In step S36, if there are, among the failed paths each transferring a failure, inferred failed paths that transfer the failure to the outputs which are not specified as failed outputs in the initialization, those inferred failed outputs are extracted. In step S37, not only the paths from the inputs to the inferred failed outputs but also the paths extending from a crossing node, from which a plurality of paths transfer the failure to the inferred failed outputs, to the inputs are extracted, followed by deletion thereof in step S38. This is because the inferred failed outputs are inconsistent with the initial state wherein the inferred failed outputs are specified as normal outputs.

In step S39, the failed paths obtained in Step S38 are classified into two cases: one which leads to the input as an inferred failed path; and the other which is stopped in the combinational circuit as an inferred faulty position. The following procedure for inferring the combinational circuit is conducted by using the inferred faulty positions and the inferred failed paths thus classified.

Referring to FIG. 10 showing a second embodiment of the present invention, the steps S40 to S43 are similar to steps S1 to S4, respectively, wherein combinational circuits are extracted by tracing from the failed outputs, and the inference is conducted separately for the cases of presence and absence of faulty positions in the combinational circuit. Steps 41 to 43 use the procedure as described heretofore with reference to FIGS. 5 to 8 to infer the failed paths and the faulty positions in the combinational circuit.

If a path is found to the input of the combinational circuit to obtain inferred input vectors, the inferred input vectors are simplified in step S44, followed by selection of paths in steps S45, wherein a failed path for a preceding combinational circuit is selected based on the failed input terminals specified in the simplified input vectors of the subject combinational circuit.

In step S44 following the step S41, the simplification of inferred input vectors uses a Boolean technique, which may, however, involve a case wherein the number of inferred vectors cannot be reduced satisfactorily in the simplification to leave a relatively large number of inferred input vectors. Step S44 uses a principle wherein the tracing of the subject failure leads to the true faulty position or the true failed input irrespective of any failed paths traced therein so long as the subject failure is due to a stacked failure, a open-circuit failure or a short-circuit (bridge) failure, and thus input values for a single failed input terminal can be unified together to reduce the number of inferred failed paths to be traced. That is, the backward tracing need not be conducted based on every inferred input vectors.

Step S45 uses one of the procedure as schematically illustrated in FIGS. 11 to 14, wherein an output vector, a plurality of inferred input vectors and an expected input vector are shown at the top in connection with the block diagram of a combinational circuit 100, and simplified (classified) input vectors are shown at the bottom.

In FIGS. 11 to 14, the plurality (ten, in this case) of inferred input vectors are obtained from the initial output vector having a failed output as specified in the figures. The inferred input vectors obtained by tracing based on the initial output vector are examined to reduce the number of inferred input vectors for simplification, wherein the inferred failed vectors are classified, and each input value is expressed in 0/1/Y/Q/D in each classified input vector.

In each of the simplified vectors shown in FIGS. 11 to 14: "0" for each input value indicates a normal sate wherein the expected value is "0", and the inferred value is also "0" in all the inferred input vectors unified for obtaining the subject classified input vector; "1" indicates a normal state wherein the expected value is "1", and the inferred value is also "1" in all the inferred vectors; "Y" indicates a failed state wherein the expected value is "0", and the inferred value is "1" in all the inferred input vectors; Q indicates a failed state wherein the expected value is "1", and the inferred value is "0" in all the inferred input vectors; and D indicates an indefinite state wherein the expected value may assume either "1" or "0", and the inferred value assumes "1" and "0" depending on the inferred vectors.

Figure 11:
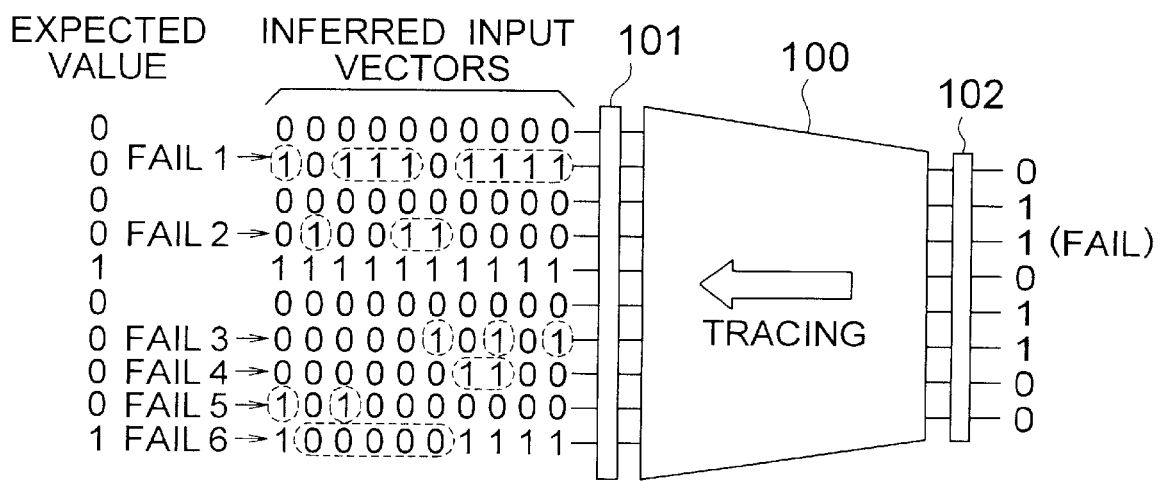
FIG. 11 is an explanatory view for showing simplification of inferred input vectors.

In FIG. 11, the input logical values encircled by dotted lines in the input terminal Fail 1 is first noted to extract an input vector of the possible input values, as shown in the column of Flail 1 at the bottom, wherein each row is filled with one of the codes 0/1/Y/Q/D corresponding to the value based on the input vectors shown at the top.

For example, the first row (0) in column Fail 1 at the bottom in FIG. 11 corresponds to the expected value "0" in the first row and "0s" in the first row of all the possible input vectors corresponding to all "1s" encircled by dotted curves in the input terminal Fail 1. The second row (Y) in column Fail 1 corresponds to the expected value "0" in the input terminal Fail 1 and "1s" of all the possible input vectors in the input terminal Fail 1, the fourth row (D) corresponds to the expected value "0" and "0s" and "1s" of all the possible input vectors in the input terminal Fail 2 corresponding to all "1s" encircled by dotted curves, and the fifth row (1) corresponds to the expected value "1" in the fifth row and "1s" of all the input vectors in the fifth row.

Then, the encircled input values in the input terminals Fail 2 to Fail 6 at the top are consecutively noted to fill the columns Fail 2 to Fail 6 at the bottom with the possible input values in each row at the top, similarly to the case of Fail 1, to obtain the reduced number (six) of possible input vectors shown at the bottom.

In the configuration shown in FIG. 11, the ten input vectors shown at the top is reduced to the six input vectors shown at the bottom, by classifying the input vectors based on each of the failed input terminals and collecting the inferred values based on the classification. More generally, the number of inferred input vectors can be reduced by the above procedure down to the number of input terminals of the combinational circuit at the maximum.

Figure 12:
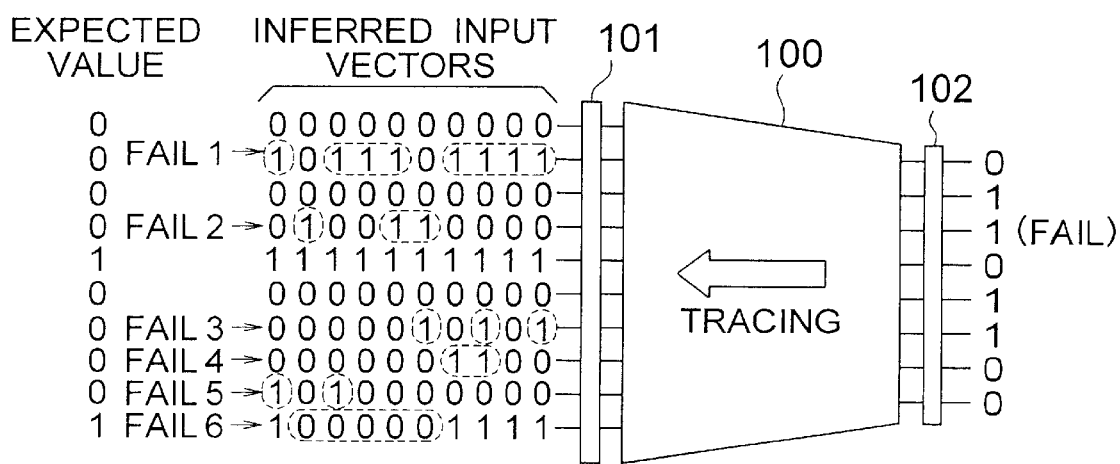
FIG. 12 is an explanatory view for showing simplification of inferred input vectors.

In FIG. 12, the Fail input terminals are consecutively noted from the top row until all the possible input vectors are classified for further reduction of the possible input vectors. In this example, the input terminals Fail 1 and Fail 2 are sufficient, as understood from the input vectors shown at the top, wherein the two rows covers all the ten inferred input vectors. It is to be noted that after the classification based on input terminal Fail 2, all the possible input vectors are covered so that the faulty positions or failed paths in the preceding combinational circuit can be found by tracing the paths specified by Y/D/Q of the selected input vectors.

The remaining input terminals not noted in the classification, for example, Fail 3 and Fail 6 can be covered by the classification based on the input terminals Fail 1 and Fail 2, as shown in the bottom of FIG. 12. This is because the encircled values in the input terminal Fail 3 and Fail 6 are covered by the encircled values in the input terminals Fail 1 and Fail 2. Other remaining input terminals Fail 4 and Fail 5 are covered by the classification based on Fail 1, as shown at the bottom. The procedure shown in FIG. 12 can further reduce the number of classified input vectors.

Figure 13:
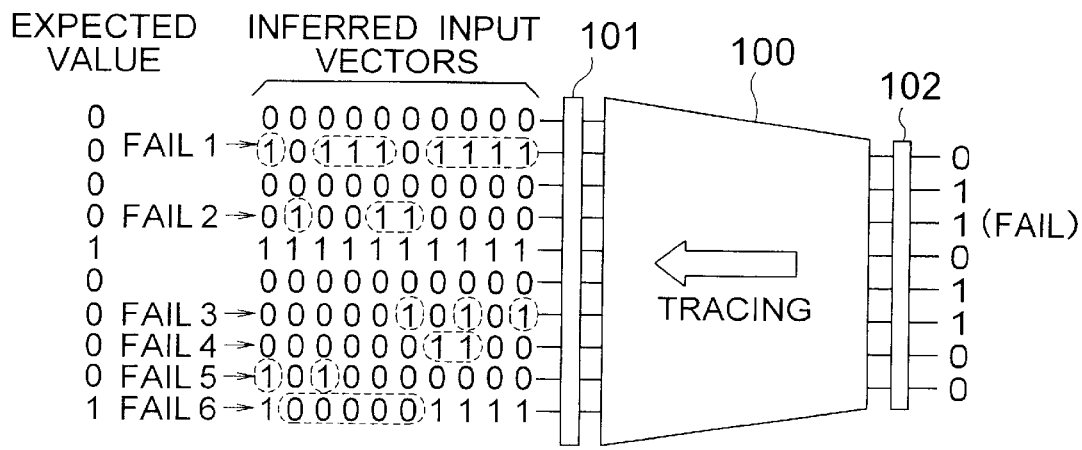
FIG. 13 is an explanatory view for showing simplification of inferred input vectors.

In FIG. 13, the number (frequency) of failed input values on each failed input is first counted based on the inferred input vectors shown at the top, the result of which is shown at the middle of FIG. 13. The failed inputs are consecutively noted based on the frequency of the failed input values in a descending order until all the inferred input vectors are covered. In this example, failed input terminals Fail 1 and Fail 6 are sufficient to cover all the inferred input vectors as shown at the bottom. In this configuration, in addition to the advantage by the procedure shown in FIG. 12, the number of classified input vectors may be further reduced.

In the classification based on FIG. 13, the frequency originally obtained is used at each classification. Alternatively, after a preceding classification is finished, the remaining failed input terminals having failed input vectors not covered by the failed input terminals used by the preceding classifications may be subjected to calculation of a new frequency. The former has an advantage of a simple procedure whereas the latter has an advantage of reduction in the number of classified input vectors.

Figure 14:
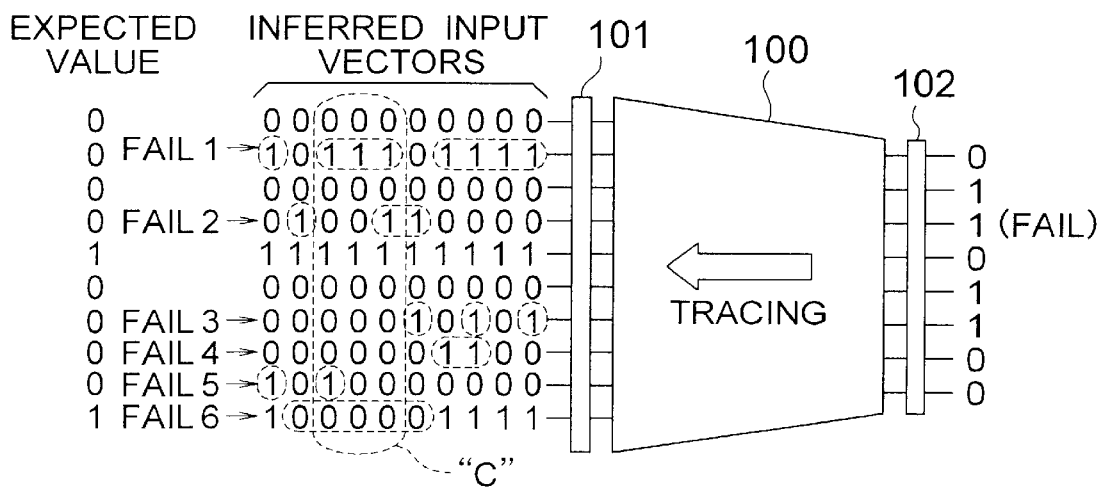
FIG. 14 is an explanatory view for showing simplification of inferred input vectors.

In FIG. 14, after the frequency of the possible failed inputs is counted for each of the failed inputs similarly to FIG. 13, two (or more) of the input vectors are combined in the descending order of the frequency to extract a classified failed input vector until all the failed input terminals are subjected to the classification. More specifically, for example, Fail 1 and Fail 6 are first combined, and by extracting failed input values encircled by dotted curves in each input terminal and contained in the common input vectors, as shown by a dotted oblong "C" to obtain a single input vector, as shown at the bottom. Fail 1 and Fail 4, Fail 1 and Fail 5, Fail 2 and Fail 6, and Fail 1 and Fail 3 are consecutively combined similarly. In this configuration, the number of classified input vectors is large; however, the number of input values each having a definite possible value is large so that the inference of the inputs of the preceding combinational circuit is easy. In other word, the number of "Ds" is small in the classified input vectors.

In an alternative example based on the procedure shown in FIG. 14, a threshold may be employed for the frequency of the input values to extract and classify the failed inputs. In another alternative example, classification based on two failed input terminals each having a frequency above a threshold is first conducted, followed by a classification based on three or more (specified number) of the remaining failed input terminals each having a number of remaining input vectors below the threshold, to obtain an input vector. The term "remaining input vectors" as used herein means that the input vectors which are not covered by the input vectors contained in the failed input terminals which are already classified.

After the classification as described with reference to FIGS. 11 to 14, the input terminals having input values Y/Q/D are selected to trace failed paths in the preceding combinational circuit. In an alternative, the input values 0/1/Y/Q/D may be replaced by another set of input values, such as 0/1/M/N as detailed below.

The value "M" is used in the case wherein the expected value is "0" and the inferred value is "0" or "1" depending on the input vectors to be noted. The value "N" is used in the case wherein the expected value is "1" and the inferred value is "0" or "1" depending on the input vectors to be noted. The advantage of this method over the method using the value "D" as described above resides in that the expected value "0" or "1" is explicitly represented by "M" or "N". The disadvantage of the method using "D" is not so crucial however, because the failed state can be examined at any time by examining the expected value.

If both "X" and another value represented by 0/1/Y/Q/D are inferred for a single input terminal after the simplification, the value "X" should be replaced by "D". This is because "X" represents the state wherein the input value may be either "0" or "1", whereas any of "0/1/Y/Q/D" represents a fixed value. This situation also occurs when a failed path is selected in a preceding combinational circuit by using a simplified input vector including "X" which means "don't care" after the simplification.

Back to FIG. 10, the candidate faulty position or positions as obtained in the combinational circuit by the steps S41 to S43 are examined in steps S46 to judge whether or not the number of faulty positions exceeds two. If the number of the faulty positions exceeds two, the last candidate faulty position as well as the corresponding inferred failed path are deleted in step S47.

FIG. 15 shows a table for the results of the inference in the interface between combinational circuits. In general, if only a single faulty position is assumed, the failure can be one of a 0/1 stacked failure (stacked to "0" or "1"), an open-circuit failure and a short-circuit (bridge) failure. In FIG. 15, the previous inference conducted to a combinational circuit succeeding the subject combinational circuit can be classified into three cases wherein: (1) only a failed path or failed paths transferring the failure is inferred; (2) a failed path transferring the failure and a single faulty position are inferred; and a failed path transferring the failure and two faulty positions are inferred.

Similarly, the inference of the subject combinational circuit is also classified into the three cases. If a single failure is assumed in the LSI, the number of faulty positions in the failure is one in the case of a 0/1 stacked failure as well as an open-circuit failure, and is two in the case of a short-circuit failure. That is, the number of faulty positions does not exceed two in any case. Accordingly, if the inference of the succeeding combinational circuits exhibits only the presence of a failed path or paths, the inference of the subject combinational circuit may exhibit one of the three cases, which specify the kinds of the failure.

In FIG. 15, it is shown that a short-circuit failure may involve both the cases of a single inferred faulty position and two inferred faulty positions. The former case occurs when one of both the nodes involved in the short-circuit failure exhibits a single failure at the time of inference, whereas the latter case occurs when both the nodes exhibit respective failures to show two faulty positions. In an ordinary short-circuit failure, the former case is usual whereas the latter may occur in a special case, because it is usual that one of both the nodes has a value which is stronger than the value of the other to thereby render the stronger value appearing on both the nodes. The latter case is shown by an asterisk in FIG. 15.

If the precedent inference effected directly before the inference of the subject combinational circuit involves a failed path and either a single faulty position or two faulty positions, a procedure for judgement similar to the case of the presence of only a failed path or paths is conducted. On the other hand, if the inference of the subject combinational circuit reveals presence of three faulty positions in the LSI, a procedure for judgement for the coincidence of locations between the inferred faulty positions is conducted. If the coincidence judgement reveals two of the physical faulty positions although there are three inferred faulty positions, these inferred faulty positions are employed as candidate faulty positions. In FIG. 15, these candidate faulty positions are shown between parentheses. In this case, the last inferred faulty positions are registered as a new extracted candidate faulty position in step S48 of FIG. 10.

Figure 17A:
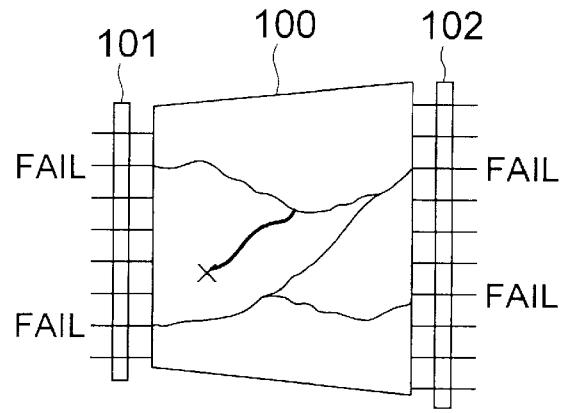
FIGS. 17A, 17B and 17C are schematic top plan views for showing extraction of candidate faulty position by superposition.
Figure 17B:
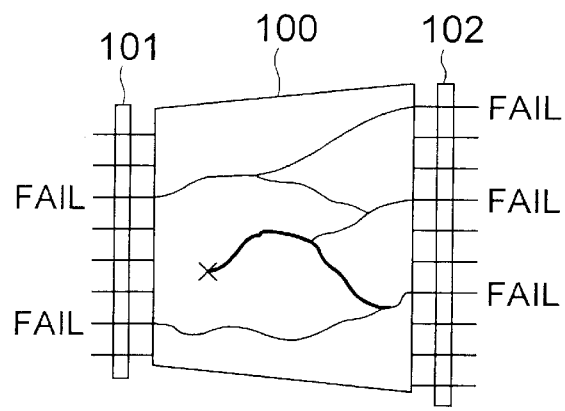
Figure 17C:
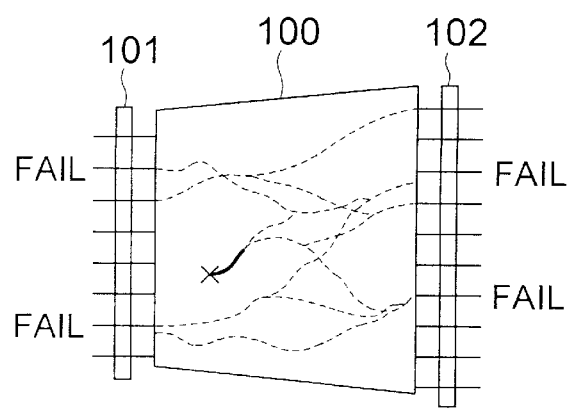

If there are two or more inferred faulty positions already found by a previous inference, a new inferred faulty position which coincides with the previous faulty position is registered as a candidate faulty position among the faulty positions obtained from each output vector of the subject combinational circuit, as shown in FIGS. 17A to 17C. FIGS. 17A and 17B illustrate two faulty positions, which are shown by gothic lines, at the same location in the combinational circuit. The portion at which the gothic lines of FIGS. 17A and 17B coincide with each other, as shown in FIG. 17C, is registered as a candidate faulty position.

Back to FIG. 10, the inferred input vectors of the combinational circuit obtained in steps S41 to S43 are simplified in step S49, followed by selection of paths in the preceding combinational circuit based on the simplified input vectors in step S50. In step S51, it is examined whether or not remaining paths exist based on which the inference is to be conducted, similarly to step S7 in FIG. 1, to judge the completion of the inference. If the inference is not completed, the process returns to step S40 to iterate above the procedure for extraction and inference of the preceding combinational circuits.

It is examined before the backward tracing for extraction of the preceding combinational circuit whether or not a new clock pulse is applied to activate the clock line of the flip-flop, which is inferred to transfer the fault, based on the expected value for the clock line to update the state of the flip-flop. If the clock line has been activated, the preceding combinational circuit is extracted and inferred based on the state at which the clock pulse has not been activated. If the clock line has not been activated, the extraction and the inference are conducted based on the state at which the last clock pulse is applied.

Figure 18:
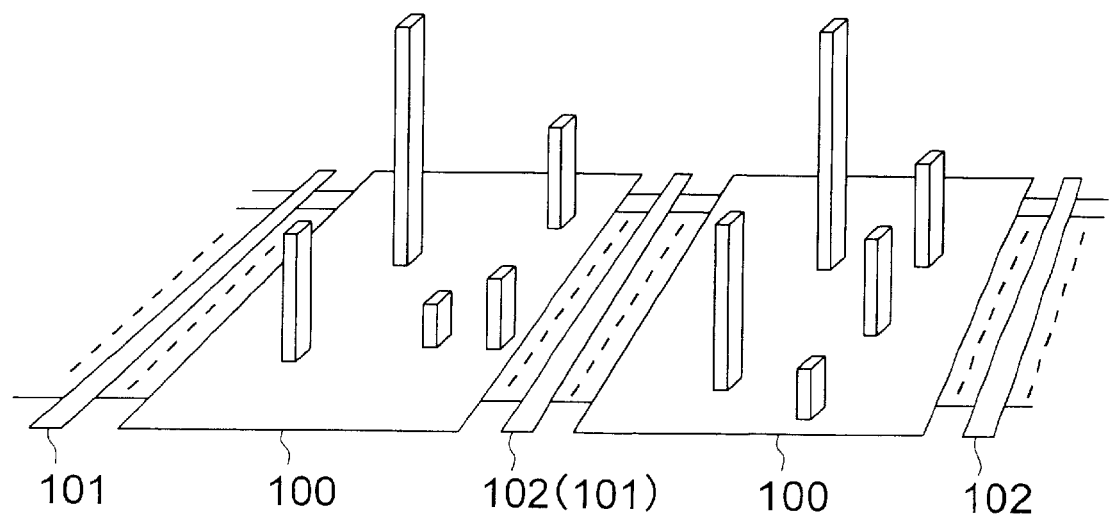
FIG. 18 is a schematic graph for showing frequency of appearance of candidate faulty positions in the combinational circuits.

In step S52, after all the candidate faulty positions are inferred and registered in step S48, the frequency of the appearance of each of the inferred faulty positions is calculated based on all the candidate faulty positions for all the time instants, as shown in FIG. 18. The length of the bars shown in FIG. 18 exhibits the frequency of the appearance of the candidate faulty position, and a longer bar reveals a higher possibility of the presence of the actual fault.

The step S52 of FIG. 10 may involve a procedure using only the candidate faulty positions obtained in step S48 or a procedure using the inferred failed paths obtained by inferences in the combinational circuits as well as the candidate faulty positions obtained in step S48. The latter procedure has an advantage in calculation of the frequency if the actual faulty position resides on the inferred failed path.

In step S53, the faulty positions are numbered for priority in a descending order of the frequency of each candidate faulty position, and the kind of the failure is also judged based on the list shown in FIG. 16, wherein the kinds of the failure are tabulated in association with the physical location of the faulty position and the inferred value. As shown in FIG. 16, the judgment of the kinds of the failure is based on the principles: (1) a 0/1 stacked failure is inferred when both the physical location of the faulty position and the resulting inferred value are fixed with time; (2) an open circuit failure or a short circuit failure is inferred when the number of the inferred faulty positions is one, the physical location thereof is fixed and the inferred value changes with time; and (3) a short circuit failure is inferred when the number of the inferred faulty positions is two, the physical location thereof is fixed and the inferred value changes with time.

Figure 19:
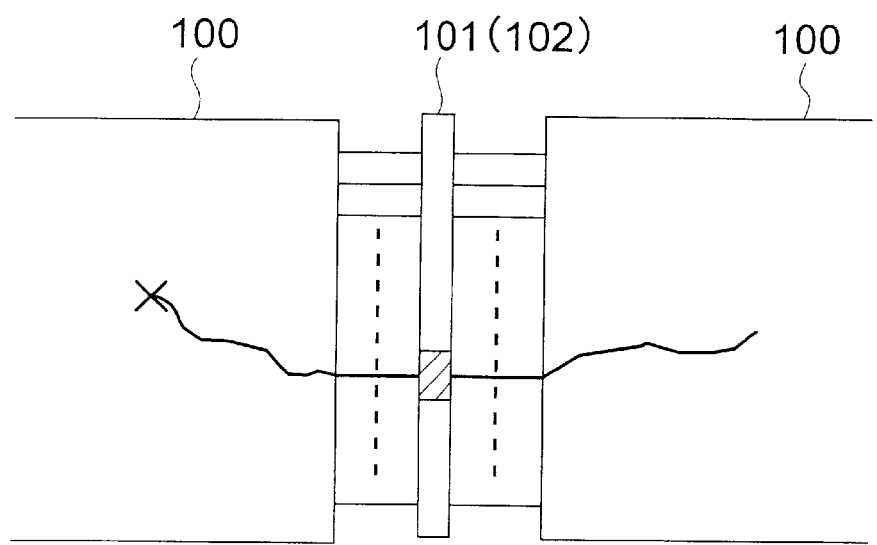
FIG. 19 is a schematic partial top plan view of combinational circuits for showing candidate faulty positions in the case of presence of a faulty position at a latch circuit;.
Figure 20:
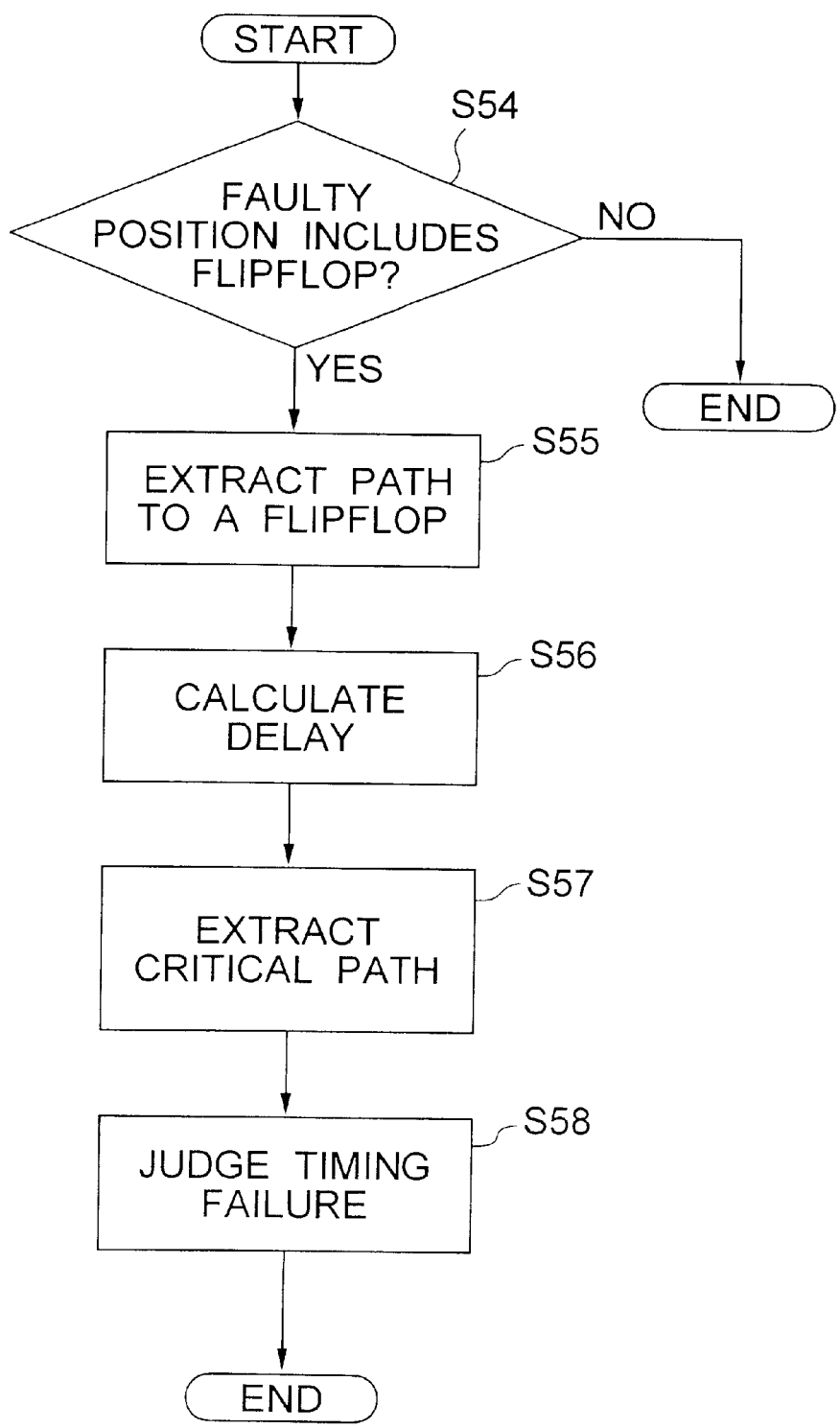
FIG. 20 is a flowchart for judgment of a timing fault.

In addition to the inferred faulty position and the kind of the failure as obtained, a timing failure may be additionally obtained in step S53 by adding the procedure for timing judgement such as shown in FIG. 20. In step S54, it is examined whether a flip-flop (or latch circuit) is involved at the inferred faulty position. This procedure is conducted by examining whether or not the candidate faulty position shown by a gothic line in FIG. 19 resides on the terminal of a flip-flop. In the example shown in FIG. 19, it may be considered that an actual faulty position resides on the illustrated path or that the flip-flop shown by hatching involves a timing error to output an error signal.

In step S55 in FIG. 20, all the paths which lead to all the inferred faulty flip-flops in the combinational circuit are extracted.

In step S56, the delay times are calculated for all the paths extracted in step S55, followed by step S57 wherein a critical path is extracted based on the delay times for the paths. Further, in step S58, it is examined whether or not a timing failure exists by comparing the expected value for the critical path against the expected value for the input of the combinational circuit to confirm that the value on each node of the critical path changes. If it is found that the inferred faulty position does not involve a flip-flop in step 54, the step for judgement of a timing failure is not conducted.

Figure 21:
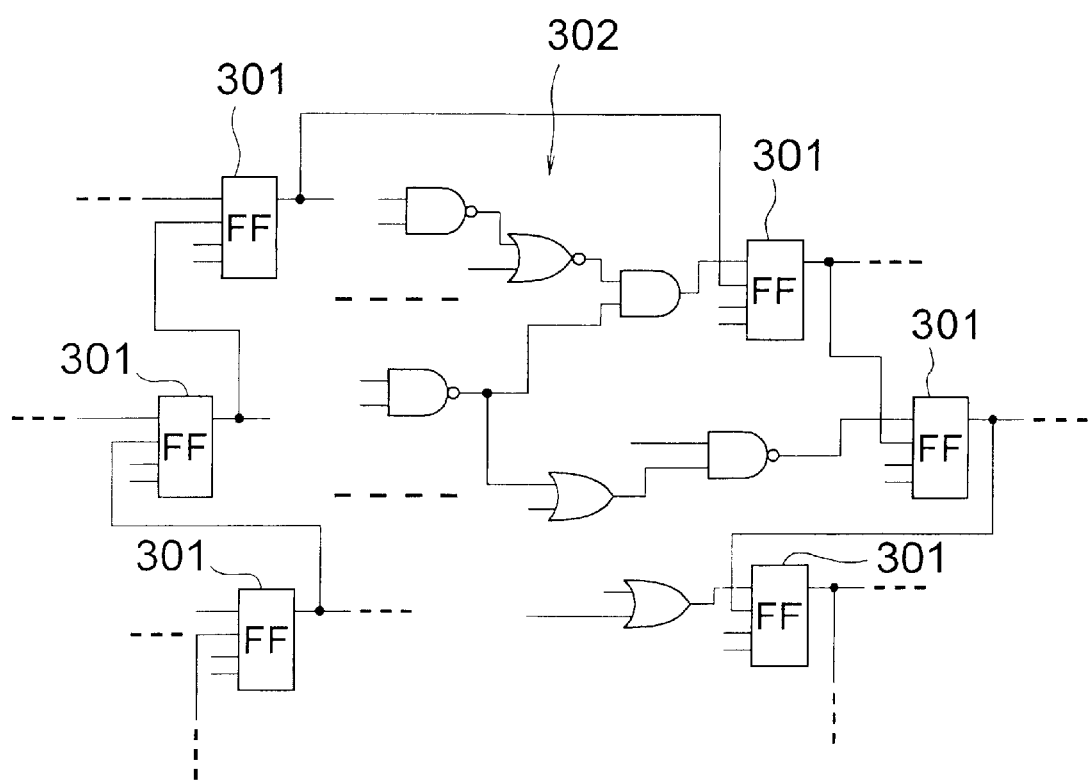
FIG. 21 is a logical circuit diagram in the case of presence of scanning flip-flops.
Figure 22:
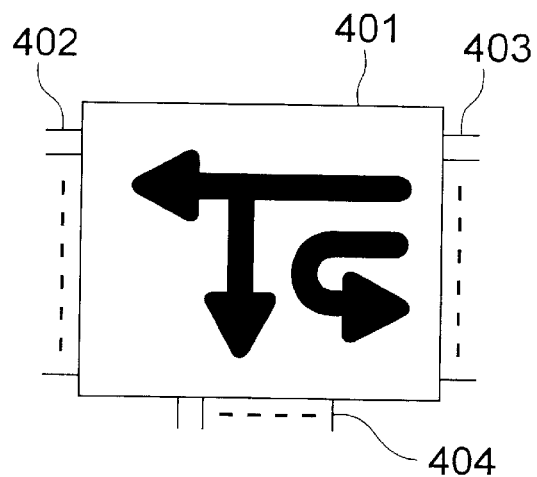
FIG. 22 is a schematic top plan view of a memory cell for showing tracing of a failure.

FIG. 21 shows an example of a LSI having a plurality of scanning flip-flops 301. During the extraction of combinational circuits 302, the scanning flip-flops 301 are also extracted, which are used for tracing and inference of the faulty positions. In this case, a preliminary step for judging whether or not scanning flip-flops are provided in the LSI is conducted to examine whether or not the scanning flip-flops 301 have a failure before extraction of the faulty positions. Then, an extraction is conducted for a combinational circuit 302 without a scanning flip-flops 301, followed by tracing of failed paths and inference of the failure.

The results of the inference for the combinational circuit 302 including flip-flops 301 and results of the inference for the combinational circuit 302 without flip-flops 301 are compared against each other to examine the scanning path including the scanning flip-flops 301 have a failure. This provides the presence of a failure on the scanning path itself.

Figure 23:
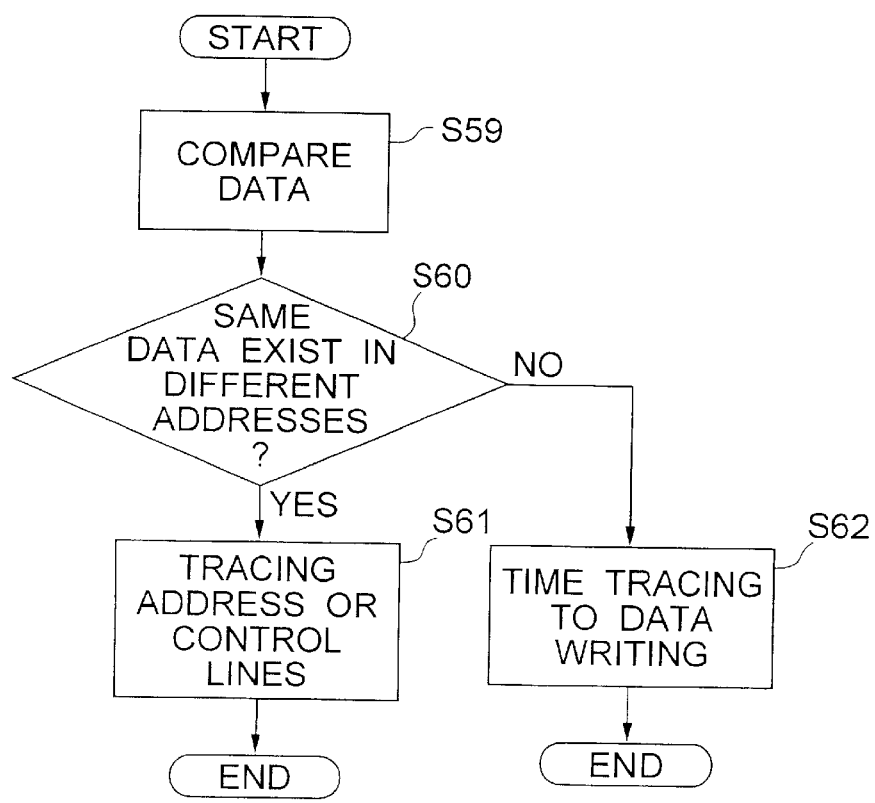
FIG. 23 is a flowchart for tracing the memory cell of FIG. 22.
Figure 24:
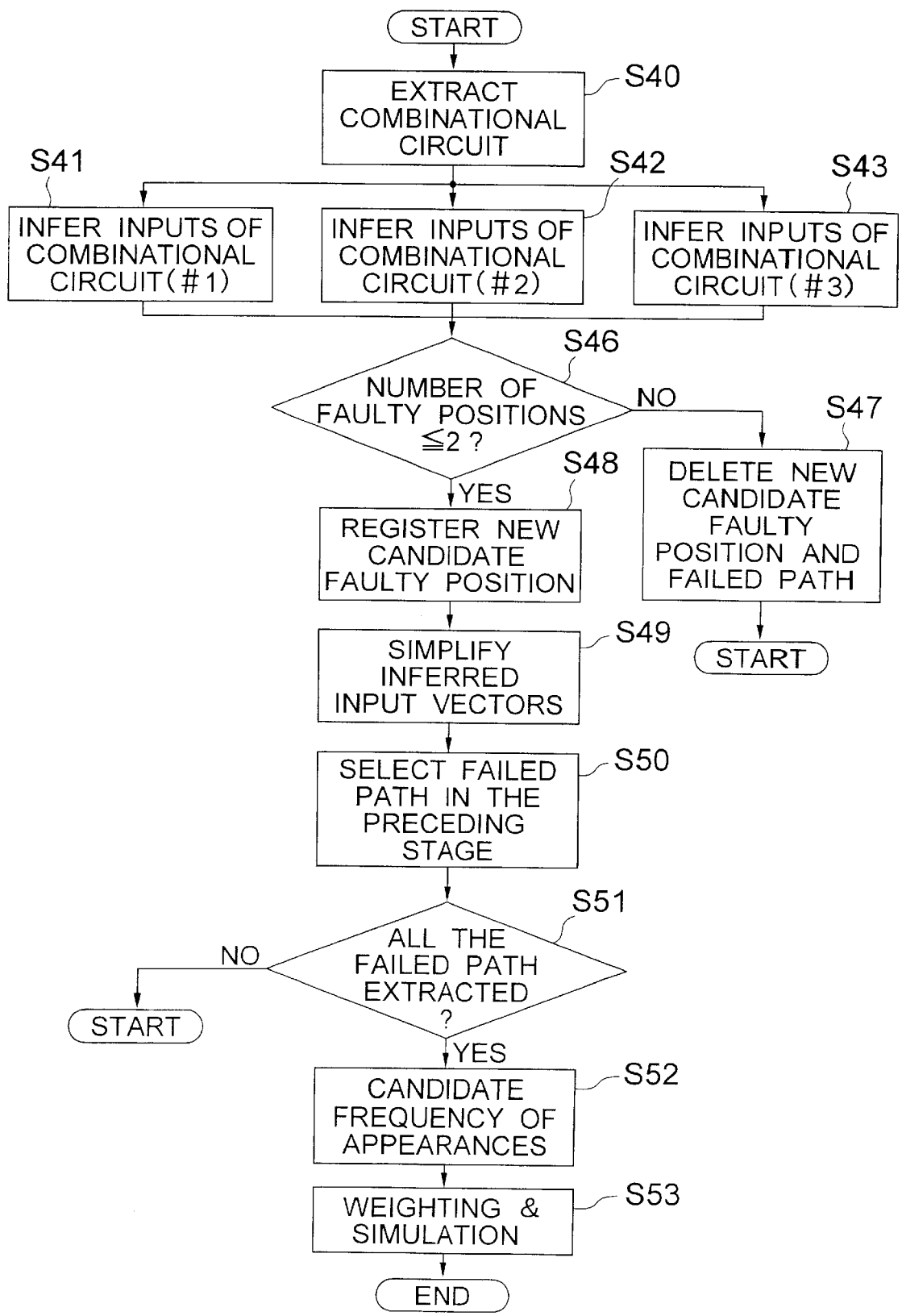
FIG. 24 is a flowchart modified from FIG. 10.

If a terminal of a memory cell is found during extraction of combinational circuits, the tracing and inference of the path is directed to data lines, address lines or control lines depending on the conditions. FIG. 23 shows the process for inference of the memory cell. If a terminal of a memory cell in a memory cell array 401 is found, it is examined whether the terminal is used for address line 402, data line 403 or control line 404. If the terminal is used for address line 402 or data line 403, the extraction and inference of the combinational circuit is conducted to include all the data lines 403 and all the address lines 402 connected to the memory cell array 401.

If the terminal is used for an address line 402, the data lines 403 are traced by using stored data, whereas if the terminal is used for a data line 403, data check is conducted based on the result of the inference of the data lines 403. In step S59, the data stored within the memory cell array 401 are read, followed by examination whether the same data is stored in other address in step S60. If the same data is stored in other address, it is probable that the other address having the same data is read in error. Thus, the other address line 402 or the control line 404 is traced based on the other address data.

If there is no same data stored in the memory cell array, it is probable that the write data was in error. In step S62, a time tracing is conducted to obtain the input vector at which the data is written in the memory cell, and a data line is traced based on the results of the time tracing. As described above, LSI can be subjected to a fault diagnosis process to infer the faulty position.

Now a second aspect of the present invention will be further described in more detail.

Basically, a fault diagnosis method of the second aspect of the present invention includes the steps of, after extraction of the combinational circuit, inferring paths traced from the failed output in each the extracted combinational circuit as inferred failed paths and a primary candidate faulty positions from which at least one candidate faulty position is selected; tracing a plurality of the inferred failed paths to draw an inferred failed route from the failed output to the candidate faulty position passing a plurality of the extracted combinational circuits; calculating frequency for each candidate faulty position based on the failed output pins; weighing the candidate faulty positions by the frequency; and selecting at least one of the candidate faulty positions having higher frequency than the others of the candidate faulty positions as a final candidate faulty position.

The process may have the step of comparing the frequency against a threshold to examine whether an expected frequency is obtained.

The process may be such that the frequency is calculated as the number of the failed output pins from which the candidate faulty position is traced, or the frequency is calculated as the number of the inferred failed routes traced to the candidate faulty position.

The process may further includes the step of classifying the candidate faulty positions by examining logical values of the candidate faulty position.

The process may be such the classifying step includes at least one of the steps including (1) selecting one of the primary candidate faulty positions having a fixed logical value;

(2) selecting one of the primary candidate faulty positions having a logical value changing with time; and (3) selecting a pair of the primary candidate faulty positions having co-related logical values as the candidate faulty position or positions.

The process may be such that the primary candidate faulty position selecting step infers a bridge failure when two primary candidate faulty positions have failed logical values at the same time of inferring.

The process may further includes the step of dividing a path portion having a single input node and a single output node into a plurality of sub-paths, wherein the primary candidate faulty position selecting step includes the step of obtaining necessary conditions required for the failed route:

(1) infers a bridge (short-circuit) failure if a pair of nodes inside the path portion have failed logical values at the same time;

(2) infers a bridge failure if the single input node has two diverging branches and the output node has two merging branches as viewed along the backward tracing; and (3) infers no bridge failure if the single input node has three or more diverging branches as viewed along the backward tracing.

Figure 25:
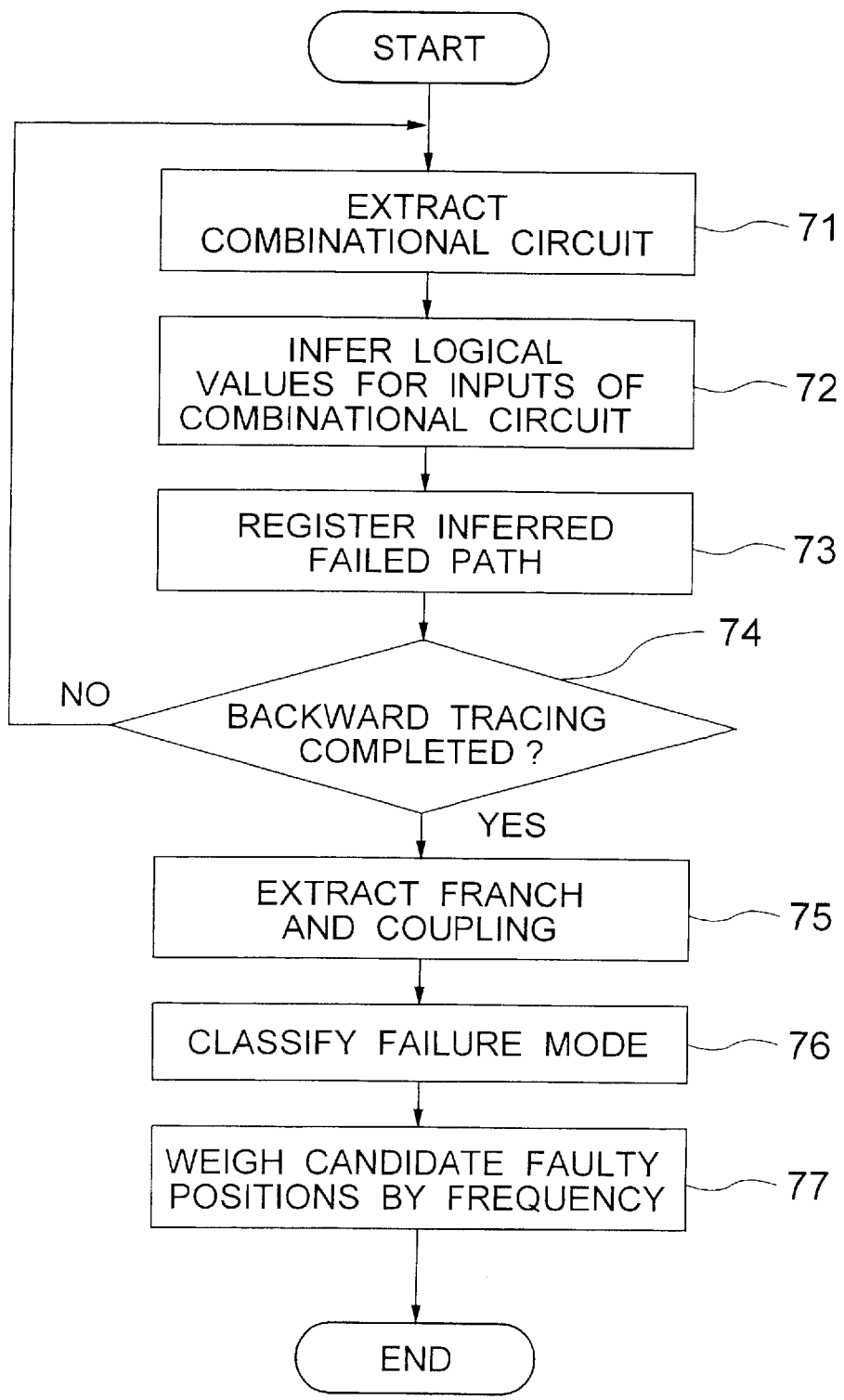
FIG. 25 is a flowchart of a fault diagnosis method according to a third embodiment of the present invention.

The process may be such that the frequency calculating step includes the step of classifying the candidate faulty position into a plurality of failure modes FIG. 25 shows a flowchart of a fault diagnosis method according to a third embodiment of the present invention. Step S71 is similar to step S1 of FIG. 1, wherein combinational circuits are extracted by backward tracing. In step S72, input vectors of each combinational circuit are inferred based on the output vectors thereof. In step S73, paths inferred as transferring the failure during inferring the input vectors in step S72 are registered as candidate faulty positions and inferred failed paths transferring the failure. Steps S71 to 73 are conducted until the backward tracing cannot provide an inferred input vector any more, and step S74 judges whether these steps are finished.

If the extraction of combinational circuits and the inference of input vectors thereof are completed for all the output vectors, the process advances to step S75, wherein the inferred failed paths registered in step S73 for each combinational circuit are examined to obtain branches (nodes each having diverging branches as viewed from the output pins) and couplings (nodes each having merging branches as viewed from the output pins) for the inferred failed paths, thereby inferring failed routes from the failed outputs to the inferred failed inputs passing the extracted combinational circuits. This step enables classification of the inferred failure on the failed route into a single faulty position, a multiple faulty position, or a mere failed path transferring a failure from the preceding stage for each candidate faulty position.

In step S76, the results obtained in step S75 are used, together with the inferred logical values at the time of inference and the inferred logical values for all the vectors, to classify the failure into one of failure modes. In step S77, the candidate faulty positions are judged by using the number of failed output pins or the number of inferred failed routes as a failure frequency and by judging the overall state of the candidate faulty positions and the logical values thereof which more satisfy the failed state, thereby numbering the candidates faulty positions in the order of the probability or weight.

In particular, in steps S75 to S77, the failure is classified based on the inferred failed paths having branches and couplings, and the frequency and the logical values for each of the candidate faulty positions are examined to obtain the overall probability of the faulty positions, thereby weighing the candidate faulty positions.

Figure 26:
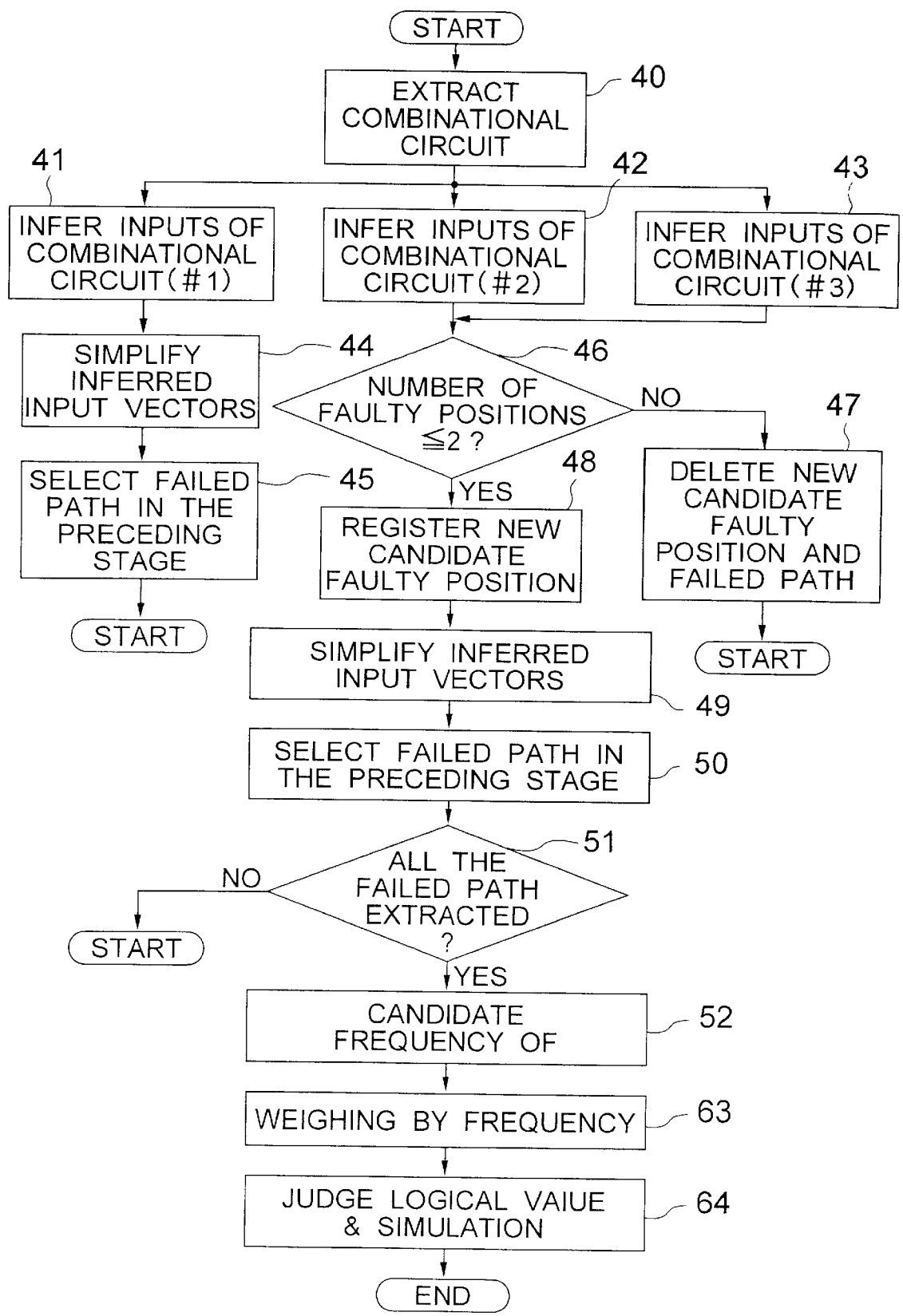
FIG. 26 is a detailed flowchart of the process of FIG. 25.

Referring to FIG. 26, there is shown a detailed flowchart of the fault diagnosis method of the present embodiment, wherein the steps corresponding to those in FIG. 10 are designated by the same reference numerals.

The present embodiment uses information of expected values for outputs of any flip-flops in the LSI obtained for all possible input vectors of the flip-flops, pass/fail information for output pins in an actual test of the LSI by a tester, and a netlist including connection information of all the nets or interconnects in the LSI, all of which are prepared beforehand. The fault diagnosis process is conducted by inference after separating the flip-flops and the combinational circuits, to obtain inferred failed paths and candidate faulty positions by coupling and connecting the inferred failed paths thus obtained for each combinational circuit. In addition, weighing of the candidate faulty positions is conducted based on the number of the failed output pins or the number of inferred failed routes carrying the failure to the failed output pins.

In step S40 for extracting combinational circuits, backward tracing is first conducted from failed output pins of the LSI, or an output of a flip-flop inferred as carrying a failure, toward the input side of the LSI for extraction of a combinational circuit. If the backward tracing of any path from the failed output pin reaches or finds an input pin of the LSI or an output of any preceding flip-flop therein, the backward tracing is finished. Then, forward tracing is conducted from the input pin or the outputs of any flip-flop thus found toward the output side of the LSI before finding another output pin of the LSI or an input of any flip-flop, thereby extracting a combinational circuit between the flip-flops found by the backward tracing and the forward tracing. Further, backward tracing and forward tracing are iteratively conducted between output pins of the LSI or inputs of any flip-flops and input pins of the LSI or outputs of any flip-flops, thereby extracting combinational circuits transferring the failure in the LSI. The backward tracing is conducted for any failed output pin in all the failed output vectors.

The thus obtained combinational circuits are subjected to three different inference steps 41 to 43 based on the cases wherein it is assumed that there is no faulty position as shown in FIG. 2A, a single faulty position as shown in FIG. 2B, and two faulty positions as shown in FIG. 2C.

Step 41 is conducted by assuming that there is no faulty position in the subject combinational circuit and the failure is transferred from the preceding combinational circuit, to infer the input vectors of the combinational circuit based on the output thereof.

Steps 42 and 43 are also conducted to infer candidate faulty position or positions in each combinational circuit and input vectors based on the inferred output vectors of the each combinational circuit, assuming that there is one or two, respectively, of faulty positions in the each combinational circuit and also a failure is transferred from the preceding combinational circuit.

In a particular case in the steps S41 to S43, no inferred input vector of the combinational circuit can be obtained based on the failed output vector thereof, whereas only an inferred faulty position or two inferred faulty positions is obtained. This means that any input vector cannot provide the failed output vector of the combinational circuit, and therefore, it can be judged that the failure is not transferred from the preceding stage combinational circuit.

A simplification formula generally used for the Boolean algebra is used in step S44, as in the case of the previous embodiments, to reduce the number of inferred input vectors of the combinational circuit obtained by inference in step S41, for selection of the paths in step S45 for a preceding stage combinational circuit. The reduction of the number of input vectors is conducted by extracting particular inputs and the logical values thereof which do not affect the failed output of the combinational circuit. These values may be either "0" or "1" to provide the given outputs.

Figure 27:
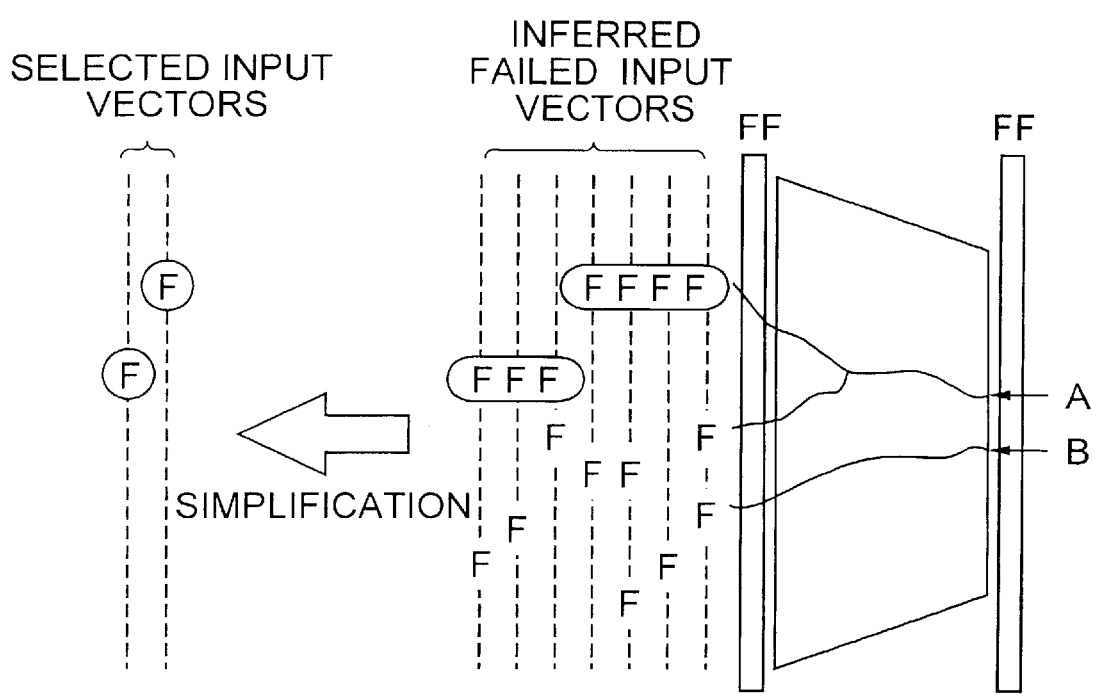
FIG. 27 is an explanatory view for showing simplification of input vector in the process of FIG. 26.

More specifically, after extraction of the inputs that assume different logical values, if the input or inputs assumes both 0/1 values in the case of a single input or assume all the 00/01/10/11 values in the case of two inputs, the logical value for the input or inputs is replaced by "x " or "xx" for the input or inputs for simplification. The selection of the failed paths in step S45 is conducted, as shown in FIG. 27, by combining the obtained inferred input vectors having the same logical value on the corresponding input terminal for reduction of the number of the inferred input vectors. After inferring the input vectors of the combinational circuit, the process advances to the step of backward tracing of a preceding combinational circuit.

A new candidate for the inferred faulty position, if obtained in step S42 and S43, is subjected to judgement as to whether the number of the candidate faulty positions including the new candidate faulty position and the candidate faulty positions previously obtained under the same condition in step S46 is equal to or below two. If the number of the candidate faulty positions thus judged exceeds two, then the new candidate faulty position is discarded in step S47. If the number of the total candidate faulty positions is equal to or below two, the new candidate is registered in step S48. In step S49, reduction of the number of inferred input vectors is conducted similarly to step S44 (S45) for simplification, followed by selection of the paths in step S50 for a preceding stage.

In step S51, it is judged whether all the output vectors are subjected to extraction of the candidate faulty position and it is also judged whether or not an inferred failed input vector can be obtained based on the output vectors, as in the specific case described above. Thus, it is determined based on the judgement to end or not to end a further inference. If it is judged that the inference is not completed, failed input terminals are extracted from the inferred failed input vector, followed by return to step S40 wherein a new combinational circuit is extracted by backward tracing from the failed output terminals. If it is judged in step S51 that all the inferred faulty positions are extracted for all the failed output vectors, frequency for each candidate faulty position is calculated in step S52 and weighing for each candidate faulty position is conducted based on the frequency in step S63.

In step S64, inference of the failure mode and improvement of the inference are conducted by judgement of the logical values and simulation, thereby preparing a inferred faulty list. In this step, it is assured that the faulty position and the logical value thereof match with the normal terminal and the logical value thereof, respectively. In addition, by examining the logical value for each candidate faulty position, the failure mode can be judged as to whether the fault is a 0/1 stacked failure, an open circuit failure or a bridge failure.

The combination of steps 52 and 63 in FIG. 26 is further described with reference to FIG. 28. Step 78 in FIG. 28 corresponds to steps 40 to 51 in FIG. 26, wherein inferred failed paths are extracted for each combinational circuit. In step S79, as shown in FIG. 29, entire routes are drawn from the failed outputs to each faulty position "X" by tracing the paths obtained in the step of extraction of a candidate faulty position and inferred failed paths and by retrieving the netlist for the paths. In FIG. 29, the numbering of the inferred failed paths corresponds to the numbering of the failed outputs, showing the relationship between the inferred failed paths and the failed outputs.

In step S80, inferred failed routes are traced from the failed outputs $\hat{1}$, $\hat{2}$ and $\hat{3}$ to the candidate faulty position "X", the tracing involving storing of a branch or coupling of the paths. The routes reaching a candidate faulty position are stored and counted for calculating a frequency of the failed outputs for the candidate faulty position. The term "frequency of the failed outputs" for the candidate faulty position, as used herein, means the number of the failed output pins from which the backward tracing starts and reaches the candidate faulty position through any of the failed routes. In this example, the candidate faulty position has a frequency of three. This step provides the relationship between the candidate faulty position and the inferred failed paths or the failed outputs for the time of inference involved.

In step S81, the procedure of step S80 is iterated for all the output vectors, and the frequency of the failed outputs is calculated for each candidate faulty position. Then, the frequency is calculated for all the failed outputs in the output vectors based on the results of step S80. In step S82, it is judged whether or not all the output vectors are subjected to the frequency calculation in step S81. In step S83, the candidate faulty positions are sorted in the descending order based on the frequency of the failed outputs obtained in step S81 and weighed based on the frequency for selection of inferred faulty positions. In this procedure, the principle is based on the fact that the candidate faulty position that has a largest frequency of the failed outputs among all the candidate faulty positions is most likely to be a true faulty position, and thus is selected.

Figure 28:
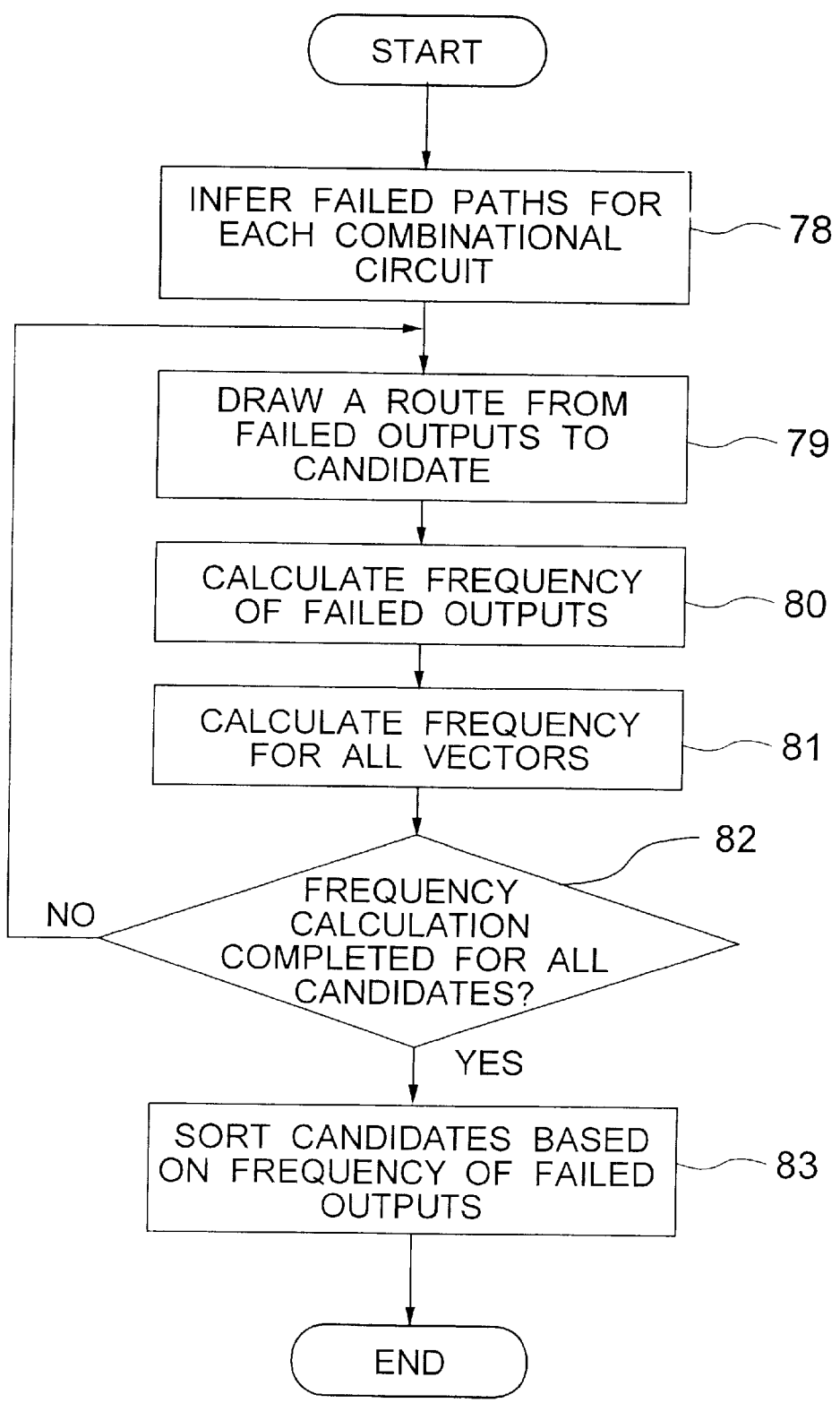
FIG. 28 is a detailed partial flowchart of the process of FIG. 25.
Figure 29:
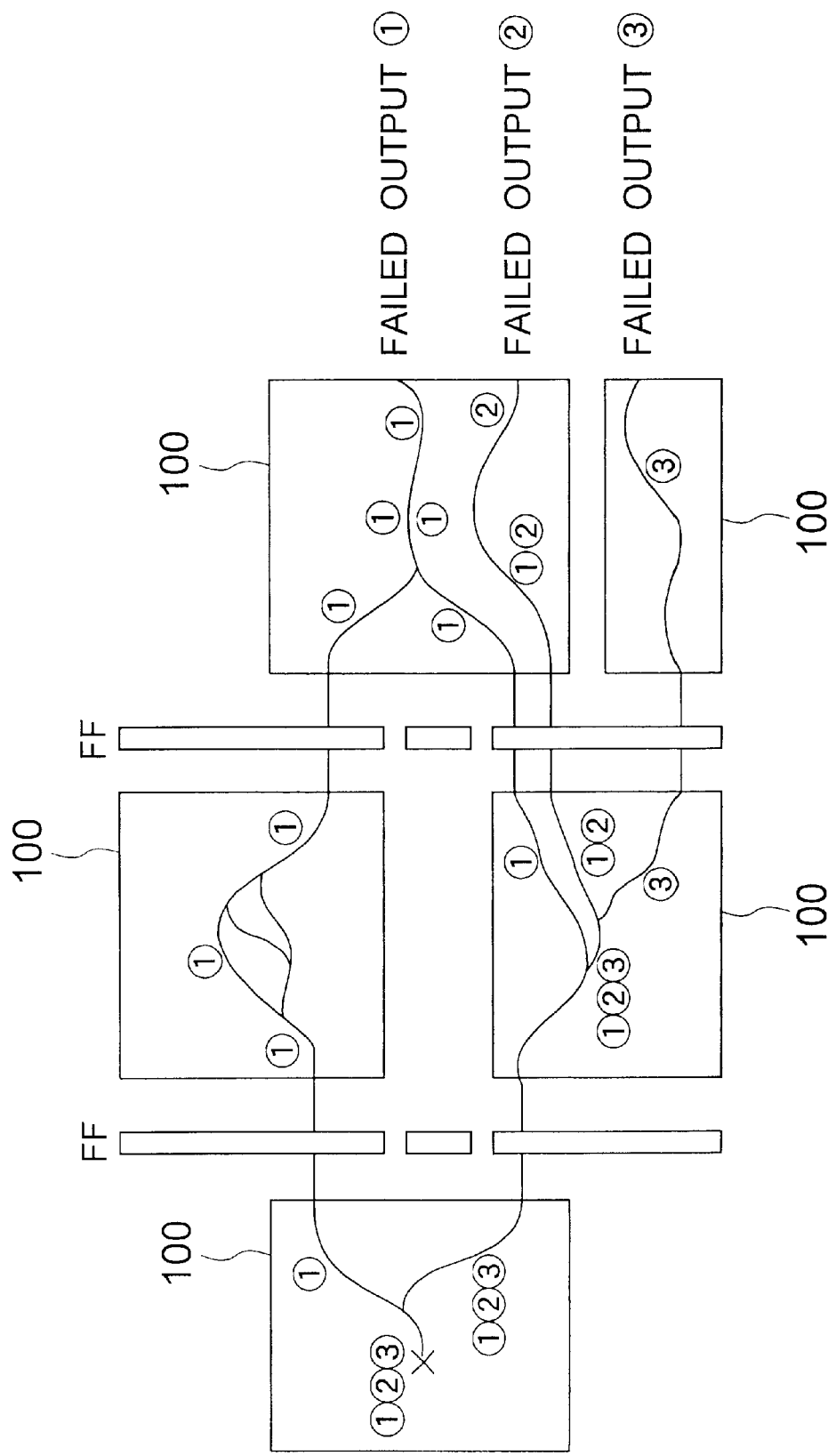
FIG. 29 is a schematic top plan view of a portion of a LSI for showing inferred failed route obtained in the process of FIG. 28.
Figure 30:
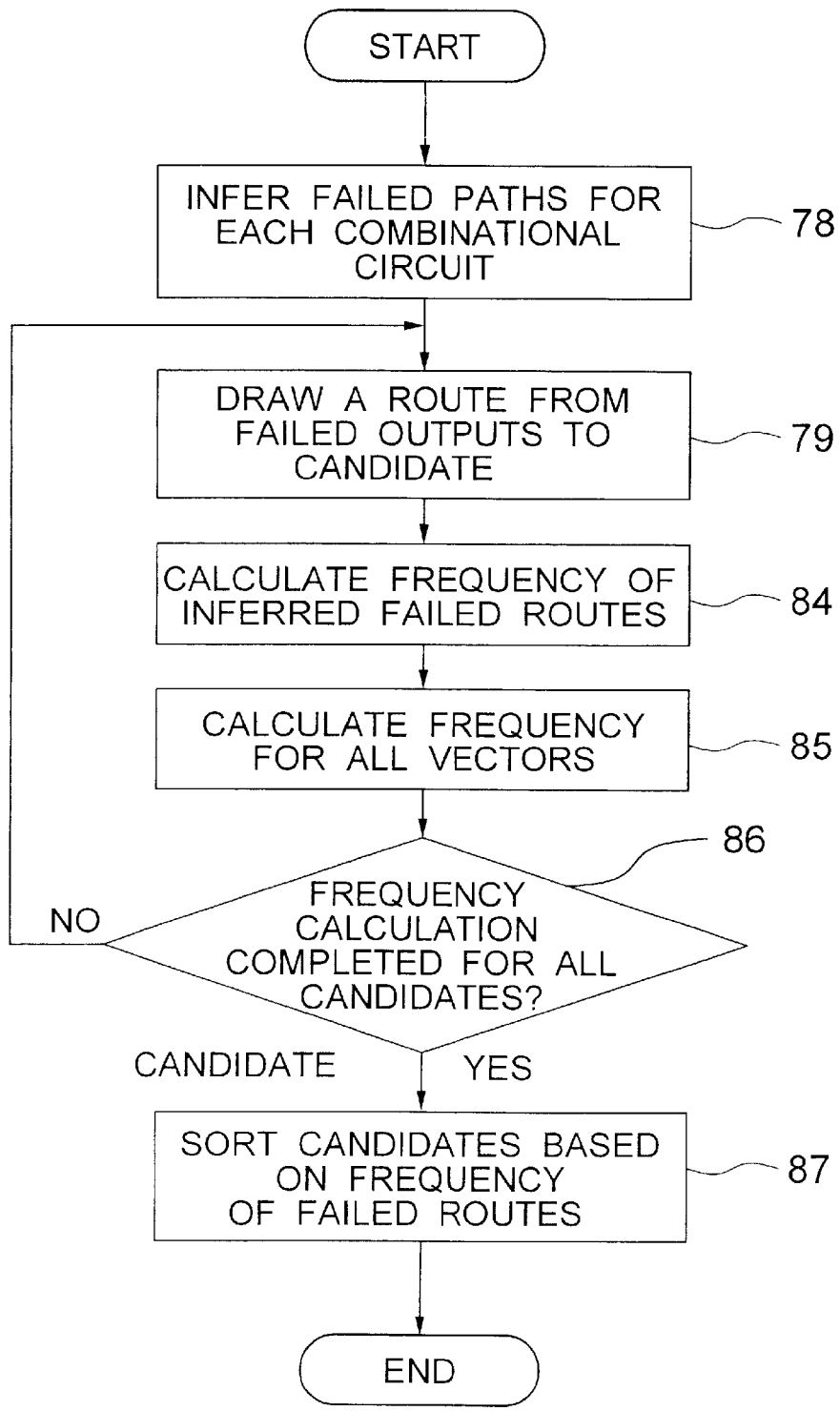
FIG. 30 is a modified flowchart obtained from FIG. 28.

Referring to FIG. 30, there is shown a modification of FIG. 28, wherein a different weighing scheme is conducted for the candidate faulty positions. Steps 78 and 79 are similar to those in FIG. 28 and obtain the routes of inferred failed paths shown in FIG. 31 which is similar to that in FIG. 29 as to the location and the number of the routes.

In step S84, frequency for the candidate faulty position is calculated based on the frequency of appearance of the entire ailed routes. Specifically, backward tracing is conducted from each failed output, as in the case of FIG. 29, and the number of the routes reaching the candidate faulty position "X" is calculated. In this step, if the trace finds a branch of a path during the backward tracing, each branch piece from the branch is attached with a specified mark, which means a requirement (or necessary condition) for satisfying the specific failed output.

For example, the failed output $\hat{1}$ is satisfied only when $\hat{1}'$ and $\hat{1}''$ is satisfied at the same time at the first branch found by backward tracing from the failed output $\hat{1}$, and $\hat{1}'$ is satisfied only when $\hat{1}'''$ and $\hat{1}''''$ are satisfied at the same time at the second branch. If the trace finds a coupling of paths and both the paths originate from different failed outputs, the frequency is added. On the other hand, if both the paths carry the same failed output having different marks at the coupling, the frequency is only merged.

Thus, at the coupling in the vicinity of the candidate faulty position, the frequency of the failed routes is counted as follows:

$$\hat{1}''' + (\hat{1}'' + \hat{1}''') + \hat{2} + \hat{3} = (\hat{1}''' + \hat{1}''') +$$
$$\hat{1}'' + \hat{2} + \hat{3}$$
$$= \hat{1}' + \hat{1}'' + \hat{2} + \hat{3}$$
$$= \hat{1} + \hat{2} + \hat{3}.$$

This calculation is obtained by storing the relationship $\hat{1}' + \hat{1}'' = \hat{1}$ at the first branch from the failed output, and $(\hat{1}''' + \hat{1}'''') = \hat{1}'$ at the second branch. Thus, the frequency of the failed routes for the candidate faulty position is calculated at three $(\hat{1} + \hat{2} + \hat{3})$ as shown in FIG. 31.

Figure 31:
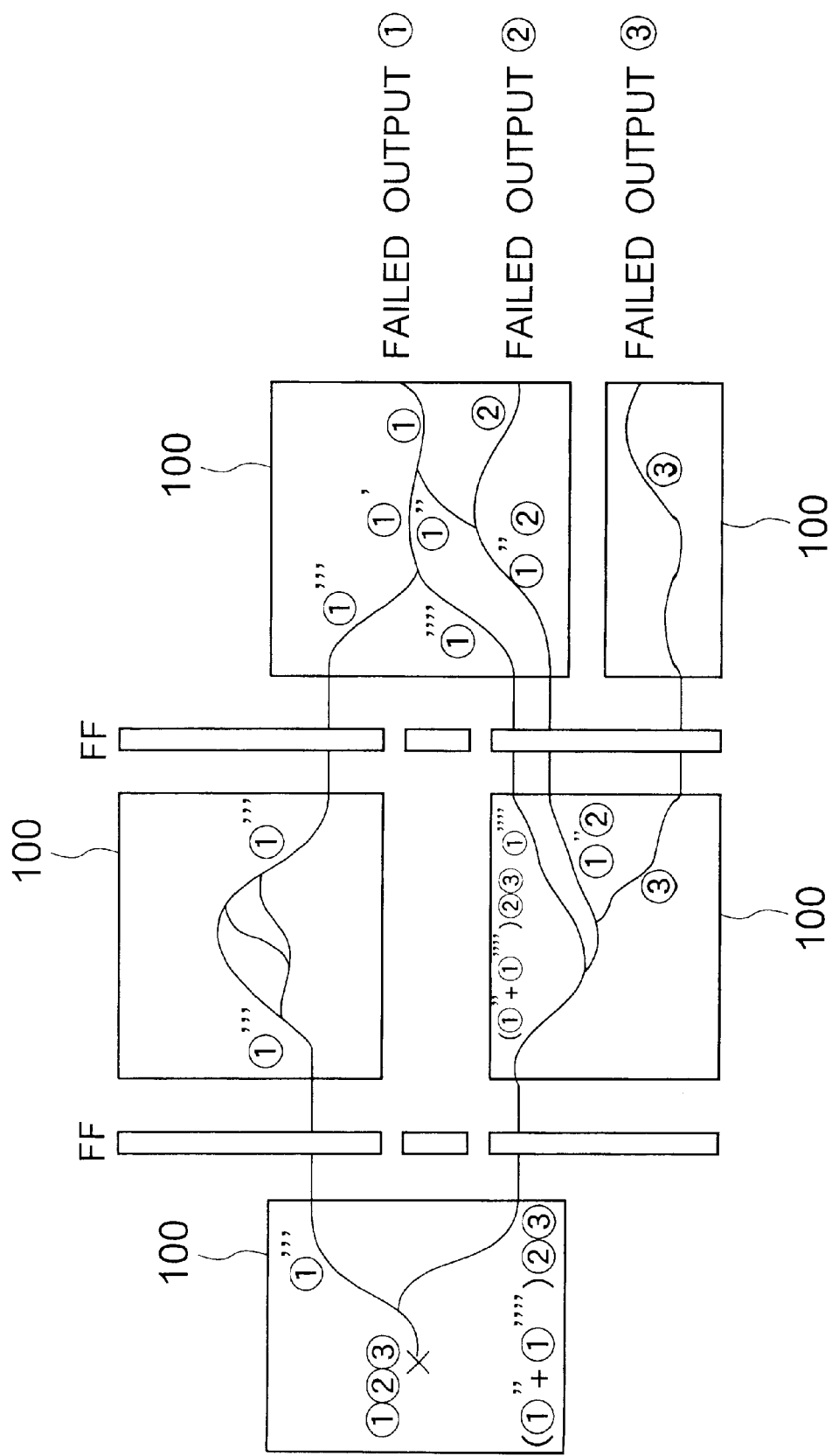
FIG. 31 is a schematic top plan view of a portion of a LSI for showing inferred failed routes obtained in the process of FIG. 30.

The procedure shown in FIG. 31 provides detailed relationship between each failed output and the failed routes or the candidate faulty position, and therefore a more accurate inference for the actual faulty position, by reducing the number of the candidate faulty positions.

In step S85 of FIG. 30, the procedure of step S84 is iterated from the failed outputs for all the output vectors to obtain the frequency of the inferred failed routes, whereby the frequency of the inferred failed routes is stored for all the failed outputs in all the output vectors. In step S86, it is judged whether or not all the output vectors are examined. In step S87, the candidate faulty positions are sorted in the descending order based on the frequency of the inferred failed routes, to weigh the candidate faulty positions for selecting one or more of the candidate faulty positions most satisfying the failed outputs.

Figure 32:
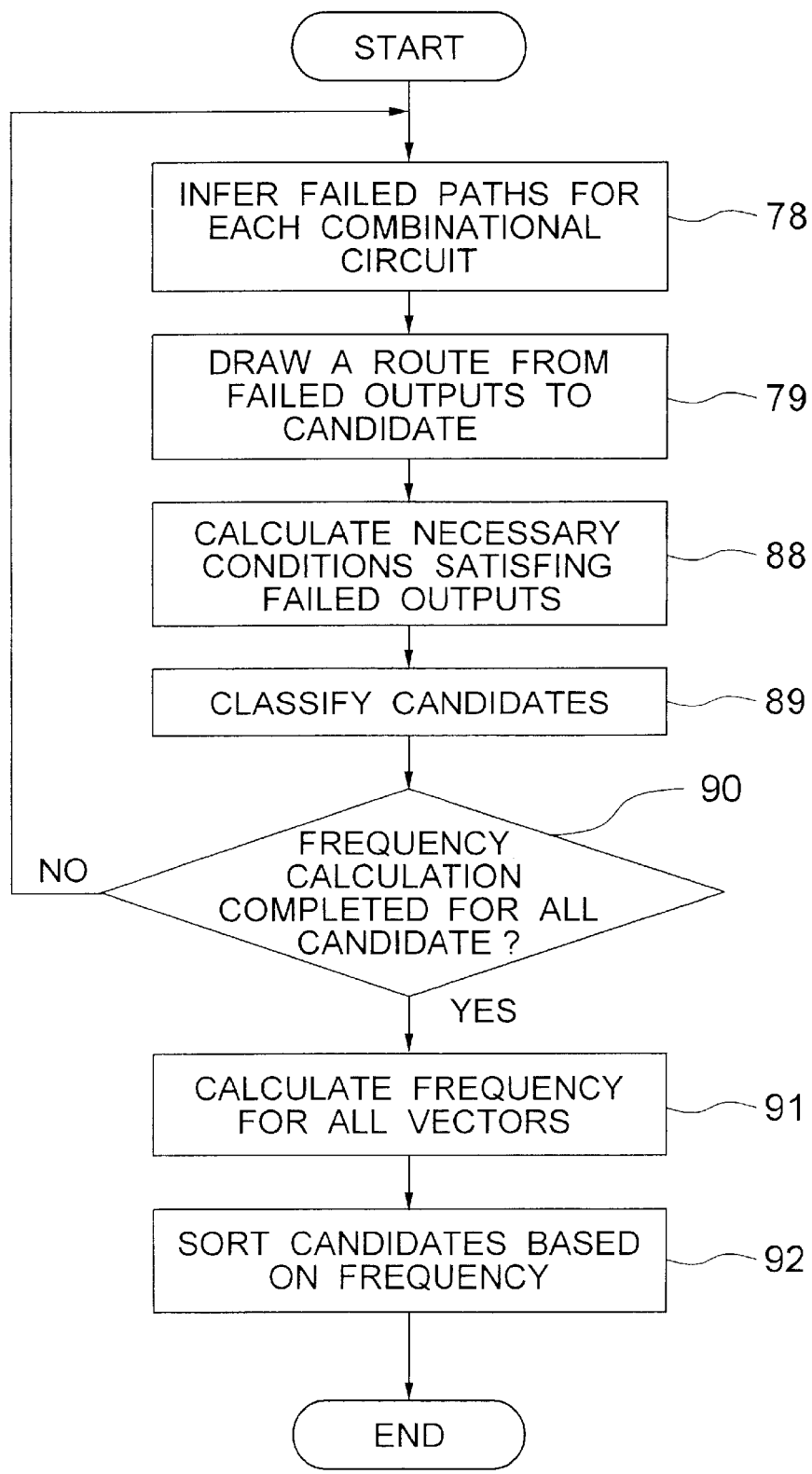
FIG. 32 is another modified flowchart obtained from FIG. 28.
Figure 33:
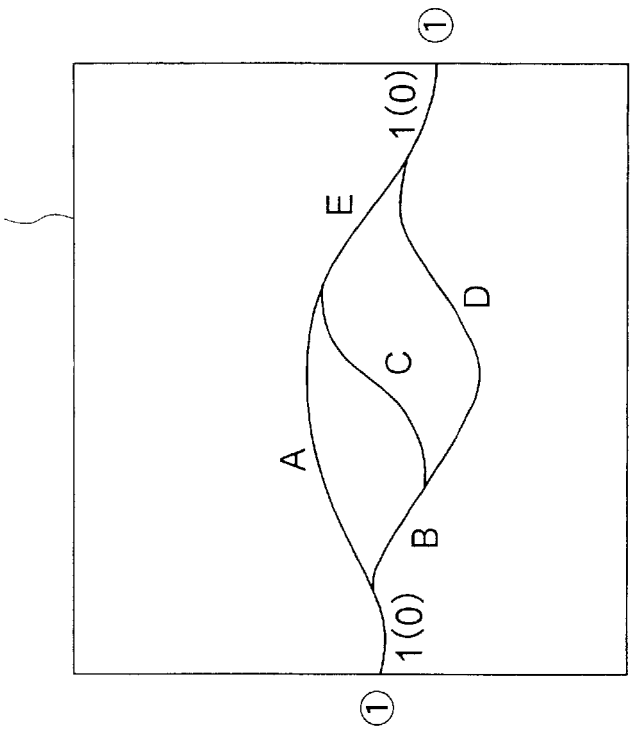
FIG. 33 is a schematic top plan view of the combinational circuit shown in FIG. 31.

FIG. 32 shows a further modification of the process shown in FIG. 30, wherein a specified portion of a failed route is further examined as to the mode of the failure in the portion. Steps S78 and S79 are similar to those in FIG. 30. In step S88, necessary conditions for satisfying the failed outputs are calculated for each failed path of the portion. FIG. 33 shows the portion for conducting a detailed examination of the inferred failed paths as to the mode thereof in step S88, exemplarily extracted from one of the combinational circuits 100 shown at the top center of FIG. 31. FIG. 33 is used for classifying a specified candidate faulty position into a single failure or a double failure.

In FIG. 33, there is a portion of a combinational circuit having a single input node and a single output node and including two branch nodes including a first branch node of diverging paths D and E and a second branch node of merging paths A and C. Table attached to FIG. 33 shows the requirements for each branch node satisfying the failed output $\hat{1}$. The left portion of the columns relates to a single failure mode whereas the right portion of the columns relates to a double failure (or a bridge failure) mode. In this example, since there are two branch nodes: one including path D and path E and the other including path A and path C, the conditions satisfying the failed output $\hat{1}$ are represented by one of the possible four cases shown in the table, which is specifically defined in the netlist. The first row "(A or C), (D or E)", for example, shown in the table is used for obtaining the requirement of "D or E" satisfying the failed output $\hat{1}$ and the requirement of "A or C" satisfying the failed path E, respectively. The digit "1" or "0" in the first row for each column "A", "B", . . . "A&B", "A&C", . . . represents "satisfies" or "not satisfies", respectively, the requirement "(A or C), (D or E)". In this configuration, for example, both (A or C) and (A & C) are included in the table because each branch may involve an OR gate and an AND gate, which is determined in the netlist.

In the table, for example, (A or C) in the row designated by "(A or C), (D or E)" in the table means that failed output $\hat{1}$ can be satisfied either path A or path C carrying a failure under the condition of connection in FIG. 33. Each column for the row is filled with the possible digit satisfying the connections shown in FIG. 33. In this case, however, it is considered that if (A or C) or (A & C) is true or satisfies the failed output, E is true because path E branches path A and path C as viewed from the failed output.

The candidate faulty position satisfying the case of the top row resides on path A, B, C, D, E, A&B, A&C, A&D, A&E, B&C, B&D, B&E, C&D, C&E and D&E, as shown by the digits "1" filled in the top row. It is to be noted that a failed path is a primary candidate faulty position.

Similarly, for obtaining the requirements of the condition (A or C), (D & E) in the case of the third row of the table, the failure $\hat{1}$ traced from the failed output $\hat{1}$ is represented based on the connections of the paths as follows:

$\hat{1}$ = D&E = D&(AorC) = (A&D) or (C&D).

Thus, the columns for A&D and C&D are filled with digit "1" in the table.

If path B has a faulty position, the failure is transferred to paths C and D, and accordingly, D&E = B&E, and C&D = C&B = B&D hold.

Further, for a double failure, $\hat{1}$ = (A&B) or (C&B) = (A&B) or B = B holds. Thus, the columns for B (single failure), A&B, B&C, B&D, B&E, and D&E (double failure) are additionally filled with digit "1".

On the other hand, if path A or C has a faulty position, it does not satisfy D & E because D & E means that path D does carry the failure, which is inconsistent with A or C having a faulty position. In addition, D or E is inconsistent with D & E. Thus, the columns for A, C, D and E is filled with digit "0".

In the table, columns for A to E represents a single failure whereas columns for A&B to D&E represents a double failure. The procedure is executed for every failed outputs. In this example, since the circuit portion of FIG. 33 is extracted from the example shown in FIG. 31, the frequency corresponding to the digit "1" is reduced to "0.25" as a probability of occurrence in the entire route of FIG. 31, because the subject combinational circuit (top center) 100 is considered to have a probability of ¼ due to $\hat{1}'''$ having a probability of ¼ of $\hat{1}$.

In step S88, specified candidate faulty positions are subjected to inference of necessary conditions satisfying the failed output by using tables such as described above.

In step S89, the candidate faulty positions are subjected to classification into a single failure mode or a double failure mode in the subject combinational circuit based on the data obtained in step S88.

In step S90, it is judged whether all the candidate faulty positions for all the output vectors are subjected to the calculation, and advances to step S91 if all the candidate faulty positions are completed, or returns to step S79 if not, wherein another combinational circuit is subjected to the calculation. In step S91, frequency for each candidate faulty position is calculated for all the output vectors based on the data as obtained in step S79. The described classification is effected into two categories including the single failure mode and the double failure mode in each combinational circuit. However, since the single failure mode includes both a stacked failure and an open circuit failure, the candidate faulty positions are further classified in this step into a stacked failure mode and an open circuit failure mode.

The classification is conducted based on the judgement whether or not the logical value is fixed for both the failed logical value and the normal logical value for all the output vectors. If the logical value is fixed then it is classified into a 0/1 stacked failure, whereas if the logical value assumes both "1" and "0" depending on the time of inference then it is classified into an open circuit failure. The double failure is classified as a bridge failure in this case. In step S92, frequency of the inferred failed routes for each candidate faulty position is calculated for each failure mode based on the conditions as obtained in step S91, and weighed based on the frequency.

Figure 34:
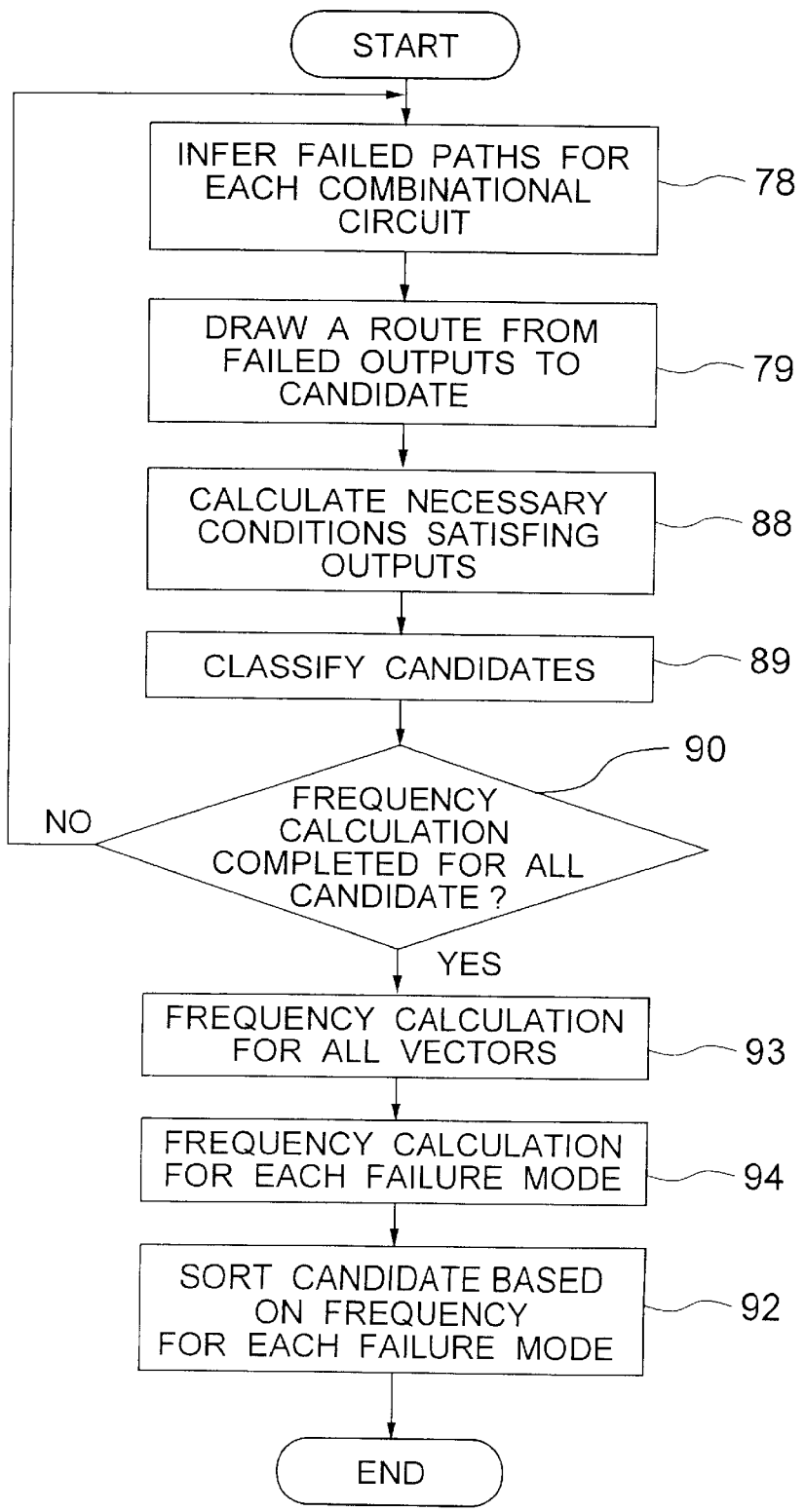
FIG. 34 is another modified flowchart obtained from FIG. 33.

Referring to FIG. 34, there is shown a further modification, wherein a bridge failure is further inferred. The process of FIG. 34 is similar to the process of FIG. 32 except for steps S93 and S94 provided in the present embodiment instead of step S91. In step S93, frequency of each candidate faulty position is calculated by using the data obtained for all the output vectors in step S89. In step S94, the failure mode is further examined for all the output vectors as to the single failure, double failure including the bridge failure, and frequency of each candidate faulty position is re-calculated for each failure mode. In step S92, the candidate faulty positions are weighed based on the recalculated frequency of the candidate faulty position for each failure mode and sorted based on the frequency.

Steps S93 and S94 are conducted for a more accurate examination of the failure mode as to the presence of a bridge failure. In this configuration, more accurate classification can be achieved in these steps because the single failure mode as classified in step S89 includes a double failure as well as an open circuit failure.

Figure 35:
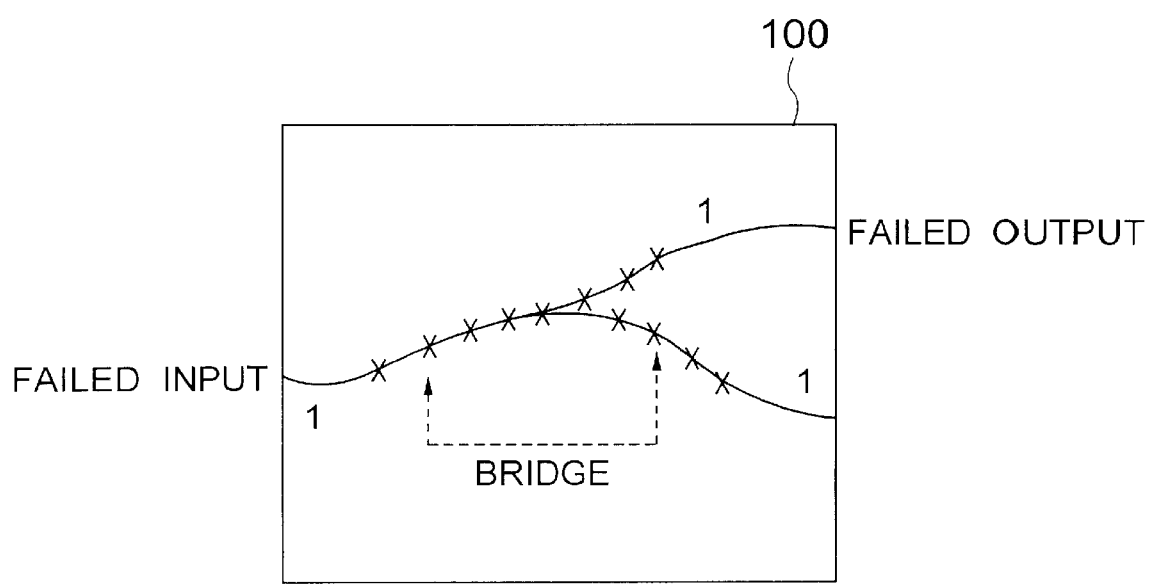
FIG. 35 is a schematic top plan view of a combinational circuit for showing inferring a bridge failure.

As described above in connection with step S93, it is highly probable that a single failure mode involves an open circuit failure if both the inferred failed value and the inferred normal value are not fixed, or changes with time. However, the case wherein inferred logical values are not fixed for all the output vectors and have correlation therebetween, such as shown in FIG. 35, may involve a bridge failure between the candidate faulty positions, both of which are obtained as equivalent faulty positions of a single failure mode. In FIG. 35, "Xs" indicate a plurality of candidate faulty positions having an equal fixed value at a time of the inference, and inferred to have a bridge failure between the candidate faulty positions illustrated.

In order to extract a bridge failure from faulty positions having a single failure mode, faulty positions each having a logical value not fixed for all output vectors is selected, followed by calculation of frequency for each faulty position, sorting the faulty positions based on the frequency thereof, comparing the logical values of the faulty positions in the sorted order, and selecting a plurality of faulty positions having an equal logical value at a time of the inference. After the selection, two faulty positions each having a frequency higher than a threshold are selected, and a frequency of the concurrent presence of the failures is obtained. In these procedures, a bridge failure which most satisfies the failed output vectors can be extracted from the faulty positions which are considered to have an open circuit failure.

In step S92, as in the case of step S92 in FIG. 32, the faulty positions classified into each mode (single 0/1 stacked failure, open-circuit failure, or bridge failure) is sorted based on the frequency thereof and weighed by the frequency. At this stage, both the inferred bridge failure classified in a double failure in step S89 and the inferred bridge failure obtained in step S94 are similarly weighed based on the frequency.

Figure 36:
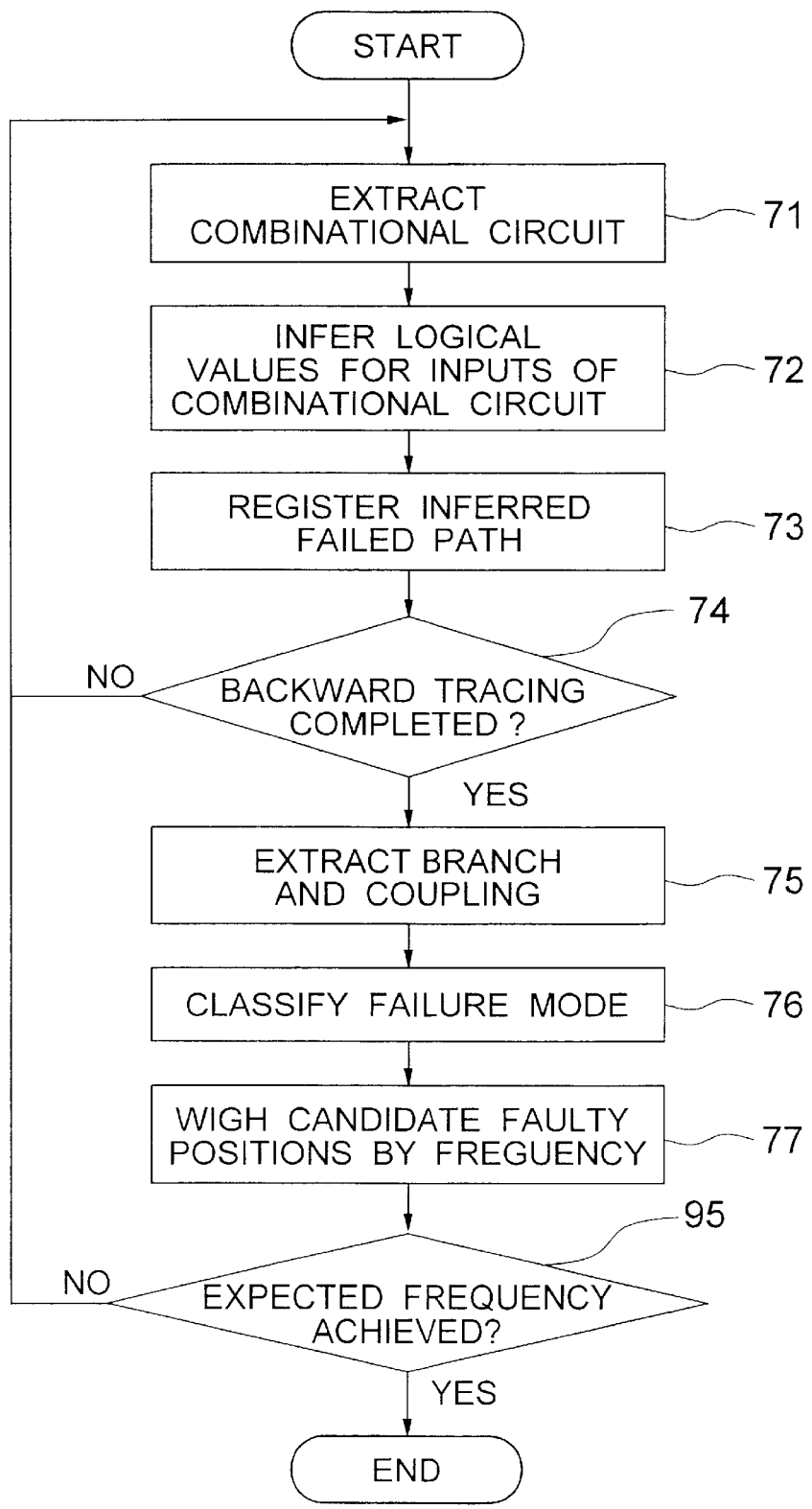
FIG. 36 is another modified flowchart obtained from FIG. 25.

Referring to FIG. 36, there is shown a modification of FIG. 25, wherein step S95 is additionally provided for examining whether or not the obtained frequency is above an expected level. By the modification, the iterative steps are finished after an expected accuracy of weighing frequency is obtained, thereby reducing the workload and the time length for the processing.

Specifically, in step S75, after all the failed paths are registered for all the combinational circuits in steps S71 to S74, inferred failed routes are drawn from the failed outputs to the candidate faulty positions while finding branches (diverging branches) and couplings (merging branches) in the inferred failed routes. This enables classification of the candidate faulty positions into a single failure, double failure or a mere failed path carrying the failure. In step S76, the candidate faulty positions are subjected to classification of the failure mode by using the results obtained in step S75 as well as the inferred logical values at the time of inference and the inferred logical values used in the previous steps for all the output vectors. In step S77, the candidate faulty positions are numbered in the order of the weight by using the frequency of the failed outputs or inferred failed routs for the candidate faulty positions and judging overall conditions which most satisfy the failed outputs, inferred logical values and failure mode.

In step S95, by examining the number of failed outputs or number of failed routes used for weighing the candidate faulty positions in step S77 and comparing the same with a threshold, it is judged whether or not an expected frequency is achieved. If the number is below the threshold, the process returns to step S71 wherein a new test vector is used for backward tracing from the failed outputs. On the other hand, if the number is equal to or above threshold, the inference is finished because the expected accuracy for the inference of candidate faulty positions is obtained.

Figure 37:
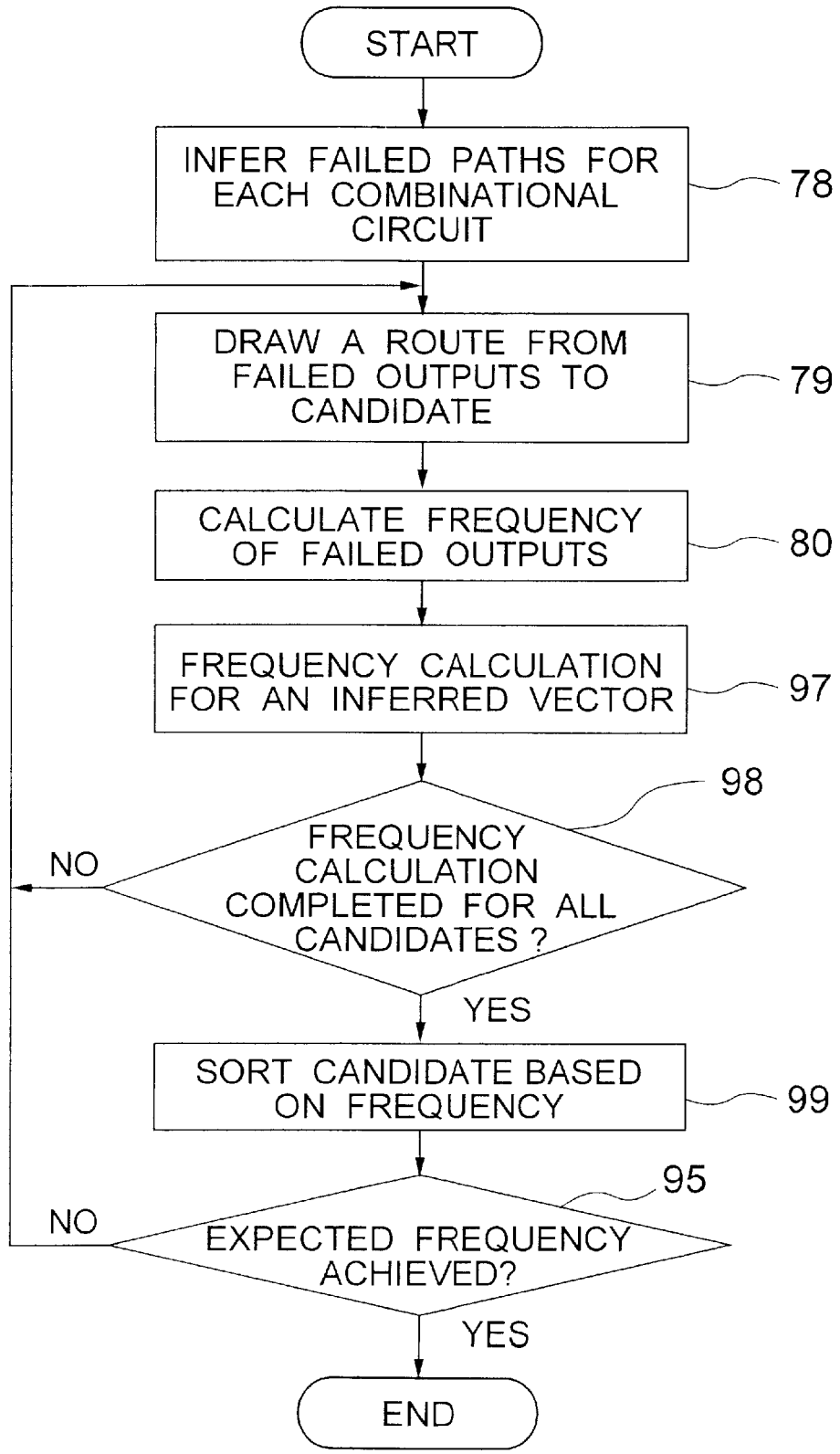
FIG. 37 is another modified flowchart obtained from FIG. 28.
Figure 38:
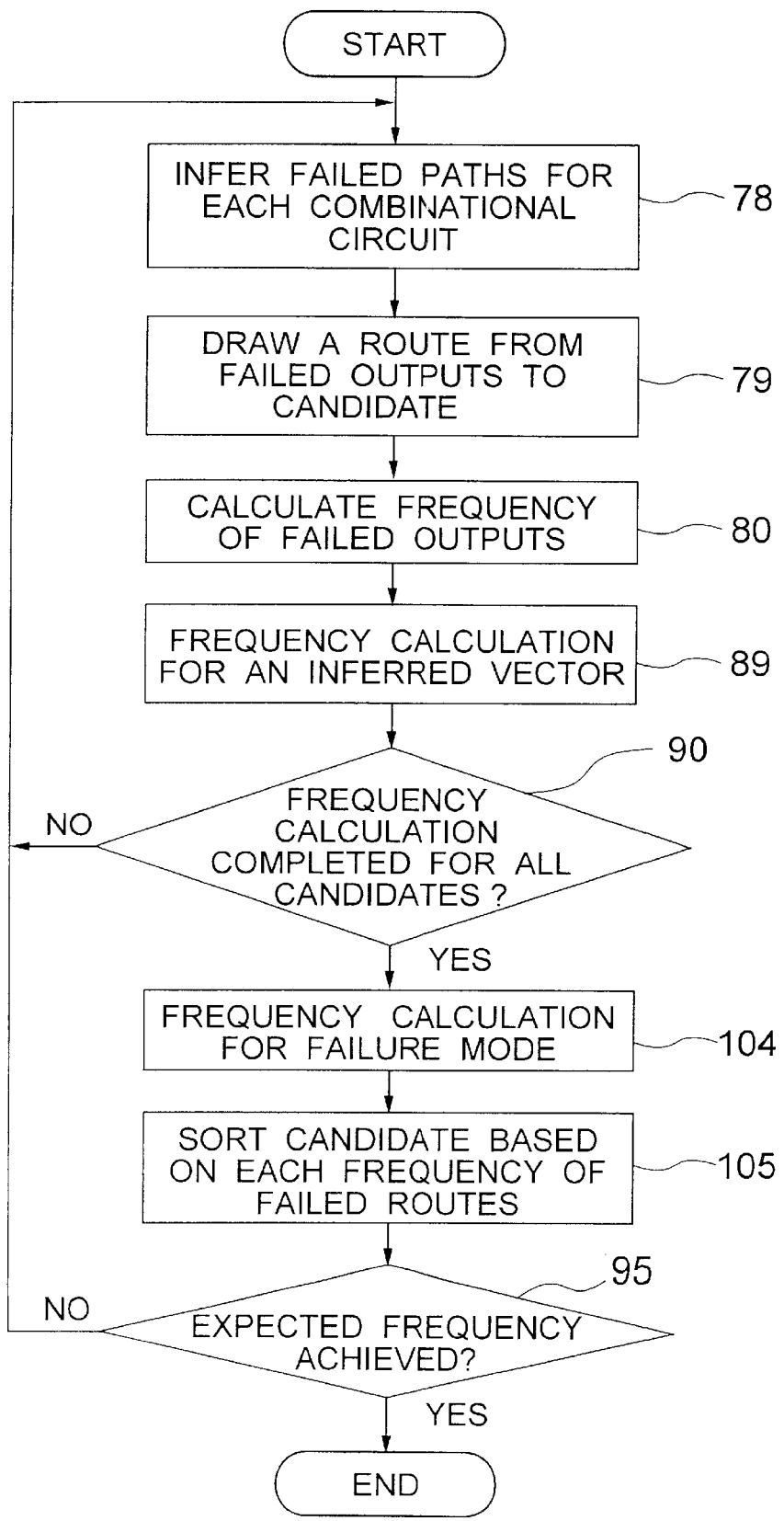
FIG. 38 is another modified flowchart obtained from FIG. 32.
Figure 39:
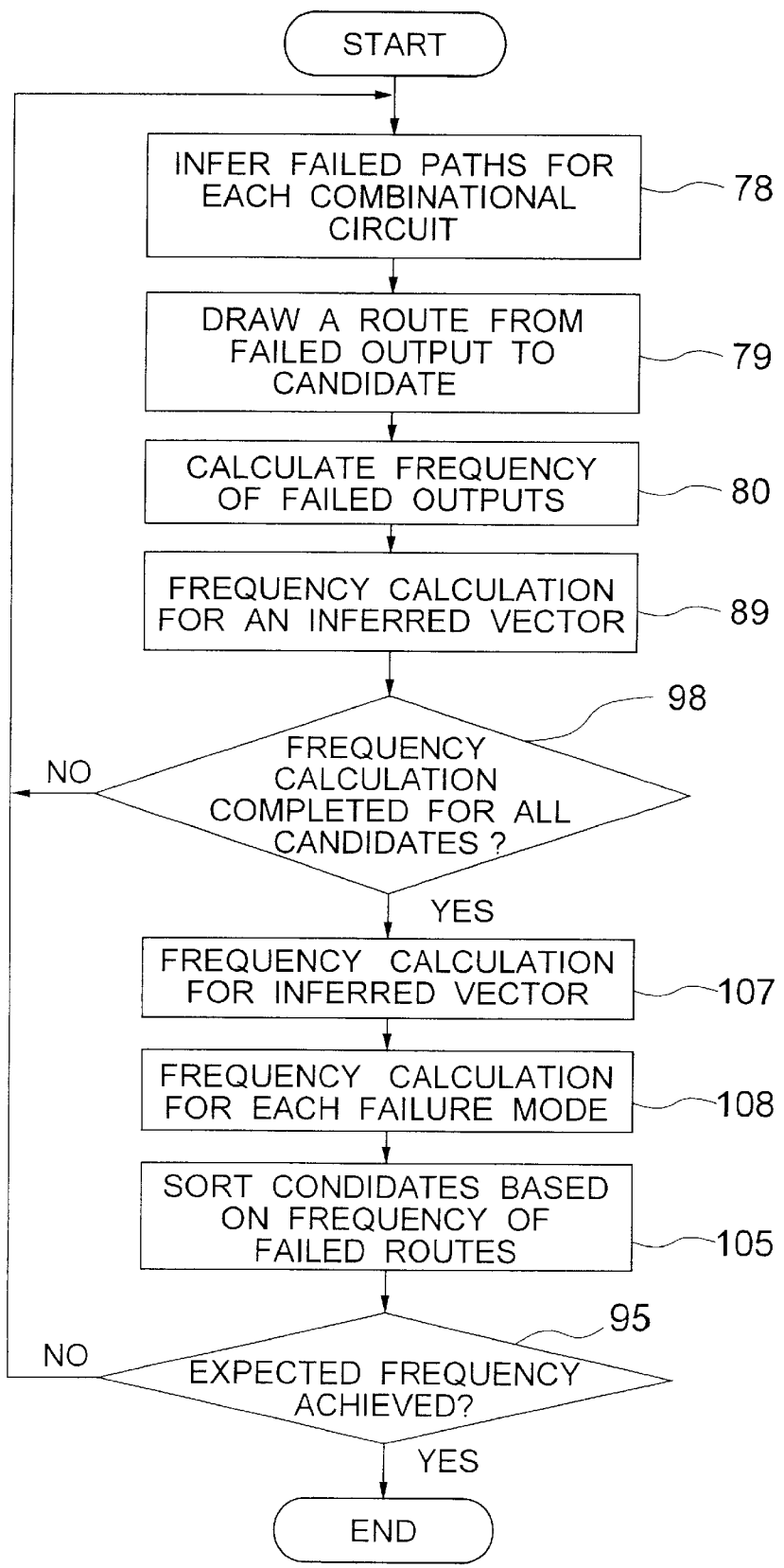
FIG. 39 is another modified flowchart obtained from FIG. 34.

FIGS. 37, 38 and 39 show modifications from the embodiments or modification of FIGS. 28. 32 and 34, respectively, by inserting step S95 before all the output vectors are subjected to backward tracing. Specifically, in FIG. 37, after it is judged in step S98 whether frequency calculation is effected to all the candidate faulty positions for a selected failed route, the candidate faulty positions are sorted in the order of the frequency in step S99. In step S95, it is judged whether an expected frequency is obtained for the selected route. If it is judged in step S95 that an expected frequency is obtained, the process is finished. If not, the process returns to step S79 to iterate the steps for drawing a new failed route and calculating the frequency until it is judged in step S95 that an expected frequency is obtained by the selected failed route at this stage. This provides reduction of workload and processing time for the inference.

In FIG. 38, it is judged in step S95 whether an expected frequency is obtained after the candidate faulty positions are subjected to frequency calculation by calculating the number of inferred failed routes considering necessary conditions and weighed by the frequency for a selected failed route in steps S104 and S105. If an expected frequency is not obtained, the process returns to step S78 where inference of failed paths are extracted.

In FIG. 39, it is judged in step S95 whether an expected frequency of inferred failed routes is obtained considering a bridge failure for a selected failed route in steps 107, 108 and 105. If an expected frequency is not obtained, the process returns to step S78 to iterate inference of failed paths and calculation of inferred failed routes considering a bridge failure.

Figure 40:
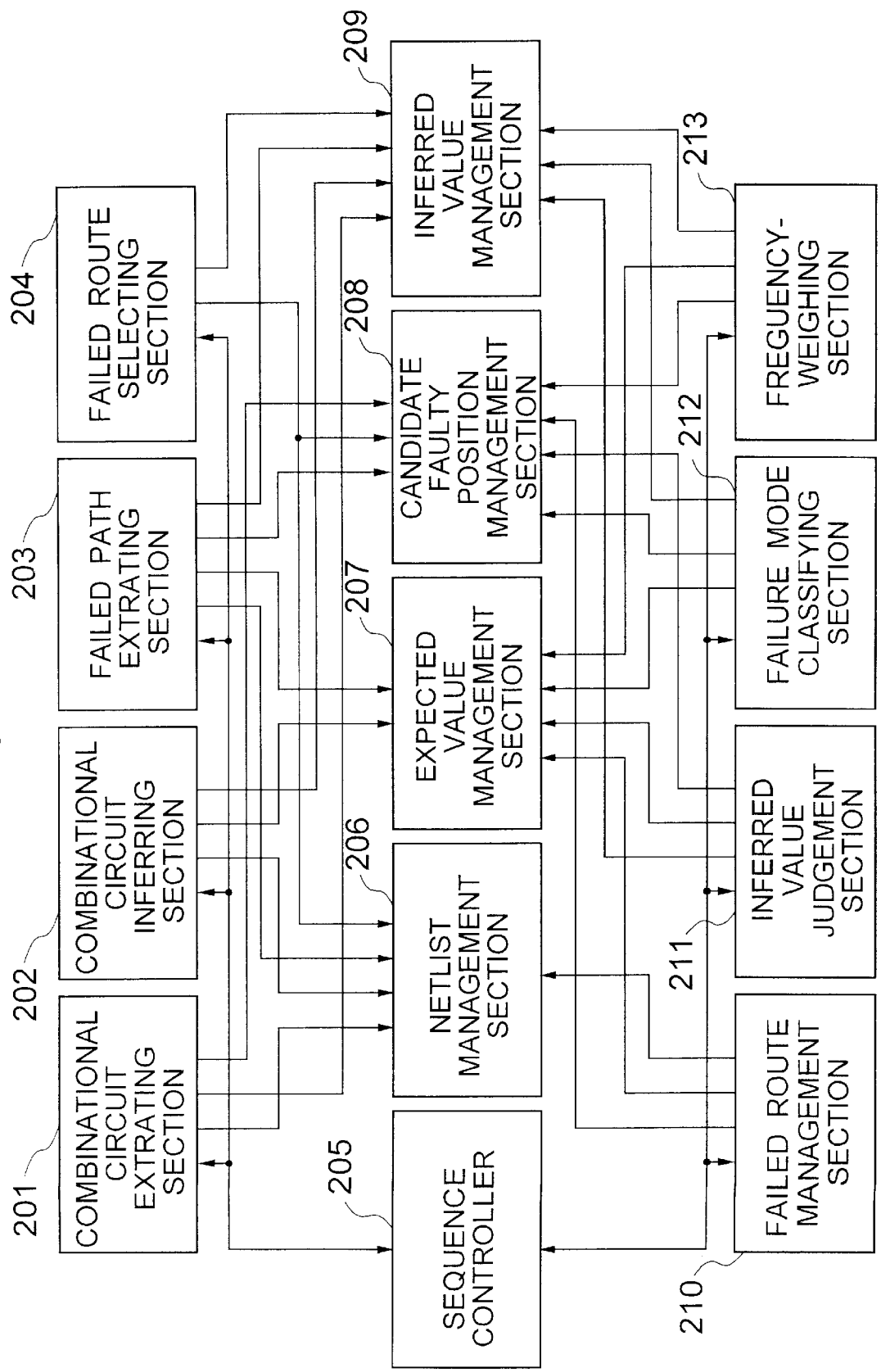
FIG. 40 is a block diagram of a fault diagnosis system according to an embodiment of the present invention.

Referring to FIG. 40, there is shown a block diagram of a faulty diagnosis system according to an embodiment of the present invention, which may be used to execute the process shown in FIG. 25.

In the system of FIG. 40, a netlist of a subject LSI is first stored in a netlist management section 206, whereas expected values for the input pins and output pins of the LSI and the expected values of the flip-flops are stored in an expected value management section 207. In addition, the logical values obtained by an actual test are stored in an inferred value management section 209.

A sequence controller 205 controls the operation of a combinational circuit extracting section 201, a combinational circuit inferring section 202, failed path extracting section 203, path selecting section 204, a failed route management section 210, inferred value judgement section 211, failure mode classifying section 212, and a frequency-weighing section 213. Especially, the sequence controller 205 controls timing or order of the operation of these sections. The netlist management section 206, the expected value management section 207, a candidate faulty position management section 208 and the inferred value management section 209 retrieve data from other sections and store or rewrite the own data for managing the data in a unified control.

The netlist management section 206 stores and controls data for connection information in the entire subject LSI and connection information in each of a plurality of combinational circuits and flip-flops divided from the subject LSI. The netlist management section 206 retrieves data for an element or route in the connection information, and registers/deletes the combinational circuits in the connection information based on the request from other sections.

The expected value management section 207 stores and controls the test results and expected values for the input and output pins of the LSI and the flip-flops. This section 207 delivers, upon request from other sections, expected values for the flip-flops etc., registers/deletes/modifies the expected values of the flip-flops as well as re-registers/deletes the expected values for the internal elements other than the flip-flops.

The candidate faulty position management section 208 stores and controls the element name and the route name of each candidate faulty position obtained by inference of the faulty positions, as well as the logical values thereof and the time of inference. This section 208 stores data for the paths and terminals of elements upon request from other sections, and retrieves/deletes/modifies the data based on the corresponding request from other sections.

The candidate faulty position management section 208 controls the candidate faulty positions, whereas the inferred value management section 209 stores the time of inference and inferred logical values. Thus, the candidate faulty position management section 208 and the inferred value management section 209 cooperate to control the data in case of a failure, whereas the inferred value management section 209 controls the data in case other than the failure. These sections 208 and 209 control data of the logical value and the time of inference irrespective of normal state or failed state of LSI, and registers/retrieves/deletes the data upon request from other sections.

The combinational circuit extracting section 201 retrieves the connection data from the connection information of the netlist management section 206, and retrieves logical values from the candidate faulty position management section 208 and the inferred vale management section 209, thereby extracting the combinational circuits inferred as including a failed path and registers the same as the partial circuits in the netlist management section 206.

The combinational circuit inferring section 202 retrieves the inferred values for the inputs and outputs of a combinational circuit stored in the inferred value management section 209 and connection data thereof from the netlist management section 206, thereby tracing inside the combinational circuit by backward tracing to infer the input vectors of the combinational circuit. The combinational circuit inferring section 202 then registers the thus obtained inferred vectors in the inferred value management section 209.

The failed path extracting section 203 extracts failed paths inside the combinational circuit based on the results obtained by the combinational circuit inferring section 202 and connection data in the netlist management section 206, Specifically, the section 203 retrieves expected values for the inputs and outputs of the combinational circuit from the expected value management section 207 to compare the same with the inferred values, thereby extracting the inferred failed paths. Each inferred failed path is also a candidate faulty position, which is registered in the candidate faulty position management section 208. The inferred value and the time of inference of the candidate faulty position is also registered in the inferred value management section 209.

The path selecting section 204 examines the inferred input vectors of the combinational circuit obtained by the combinational circuit inferring section 202 and combines the inferred failed inputs having common logical values, thereby selecting inferred failed paths. These combined inputs having common logical values are stored as a group in the inferred value management section 209 irrespective of presence or absence of a failure.

The failed route management section 210 draws failed routes from the failed outputs of the LSI to the faulty positions passing extracted combinational circuits based on the candidate faulty positions and inferred values thereof while retrieving connection data from the netlist management section 206, then registers the paths between the faulty positions and the relationship between such a path and the failed outputs in the candidate faulty position management section 208.

The inferred value judgement section 211 retrieves the candidate faulty positions, the inferred values and the time of inference from the candidate faulty position management section 208, and retrieves the logical values of all the candidate faulty positions for all the output vectors from the sections 207 and 209, thereby judging whether or not the logical value is fixed.

The failure mode classifying section 212 classifies the failure into a single 0/1 stacked mode, open circuit mode, or a bridge mode. The classification is effected by retrieving the failed paths between the candidate faulty positions and the relationship between the failed paths and the failed outputs from the candidate faulty position management section 208, and classifies the failure in more detailed modes by judging the possibility of an open circuit failure or bridge failure between the failed paths. The detailed failure mode for each candidate faulty position is registered in the candidate faulty position management section. 208 together with the logical value thereof thus retrieved.

The frequency-weighing section 213 retrieves the logical values and the failure mode for each candidate faulty position, the paths between the candidate faulty positions and the failed outputs and the relationship between the paths and the failed outputs, all registered in the candidate faulty position management section 208, and obtains overall probability of the candidate faulty positions based on the number of failed outputs or the frequency of the inferred failed routes, thereby numbering the candidate faulty positions in the order of probability for each failure mode.

Referring to FIG. 41, a modification of the faulty diagnosis system of FIG. 40 includes a server 310 for managing the netlist, a server 311 managing the expected values, a server 312 managing the candidate faulty positions and a server 313 managing the inferred value, all of which are provided on a network of a computer system instead of sections 206 to 209 in FIG. 40. The rest of the sections are similar to those in FIG. 40 and implemented as clients. The sequence controller 205 controls operation of the servers 310 to 313 and the clients 201 to 204 and 210 to 213 especially in the sequence and the timing of the operation thereof.

Each server 310, 311, 312 or 313 receives request from one of clients 201 to 204 and 210 to 213 through the network for retrieval, register or deletion of information, executes for processing based the request, and deliver the result of processing to the client that forwarded the request. Thus, each data is managed in a single section without disturbance by other sections.

In summary, in the above embodiments of the present invention, by extracting any combinational circuit while tracing an LSI by backward tracing from the failed output pins, workload and processing time can be reduced compared with the case of all the input vectors are simulated based on the assumption that each of the signal lines carries a failure.

In addition, since the inferred failed paths are limited within each extracted combinational circuit, the fault diagnosis system of the embodiments reduces the scale of the circuit involved and the processing time thereof compared with the simulation for the entire LSI. Further, it is sufficient to compare the results of simulation of a combinational circuit for the case of failed input vectors against for the case of correct input vectors. Thus, processing time can be reduced and it can be applied to reconverged circuit for extraction of failed paths.

In the inference of the failed paths in the embodiments, since the assumption is first established that there exists one or two of faulty positions in each combinational circuit if a failure does exist in the combinational circuit, there is less possibility of an error for the inference.

Further, the technique of backward tracing from the failed outputs found in the failed output vectors enables extraction of any combinational circuits and failed paths based on the vectors on the interface between the adjacent combinational circuits. Thus, the backward tracing enables to correctly infer the failure even in the case of a double failure mode such as a bridge failure, because both an independent failure and a co-related failure can be inferred. In the case of a timing error, since a critical path can be extracted and whether or not the error is a timing error can be judged based on the information obtained as a logical failure, an error inference can be substantially avoided.

Reduction or simplification of inferred input vectors and selection of failed paths for each combinational circuit provide reduction of number of combinational circuits to be extracted and the number of traced paths, thereby allowing to reduce the workload and the processing time for the inference.

The technique of the present invention can be applied to an LSI having a built-in scanning path or ROM and a RAM with a suitable sequence of processing, thereby reducing the processing time.

The technique of the present invention is superior to a fault dictionary technique due to reduced processing time. In addition, in order to raise the accuracy for inference, it is sufficient in the present invention to increase the test vectors used for the inference, which can be achieved while considering the trade-off between the processing time and the accuracy of the inference. In addition, if the faulty position resides in the vicinity of the failed outputs, the backward tracing technique provides a further smaller processing time.

In the present invention, since a double failure mode such as a bridge failure can be assumed, a single stacked failure, an open circuit failure or a bridge failure can be inferred with accuracy. This is achieved by extracting inferred failed paths while assuming a double failure and by assuming a double failure on the extracted inferred failed paths, which provides a narrowed area for the failure. This is partly because the backward tracing from the failed outputs extracts separate combinational circuits, and thus it is avoided that the paths in the vicinity of the output pins have an extremely large weight of the frequency, thereby equalizing the weight along the backward tracing. In the fault dictionary technique, if a double failure is to be assumed, the workload and processing time increases almost to a square of the number of nets in the LSI, which is impractical.

Since the above embodiments are described only for examples, the present invention is not limited to the above embodiments and various modifications or alterations can be easily made therefrom by those skilled in the art without departing from the scope of the present invention.

What is claimed is:

1. A fault diagnosis method for a LSI comprising the steps of:
  obtaining information of expected values for outputs of each flip-flop in the LSI based on each input vector of the each flip-flop, pass/fail information for each output pin in a test, and a netlist for the LSI;

consecutively extracting, based on said netlist, combinational circuits each having a plurality of inputs each connected to an input pin or an output of any flip-flop and a plurality of outputs each connected to an output pin or input of any flip-flop, the combinational circuit including nets and logic elements other than a flip-flop, wherein said tracing starts from a failed output pin by backward tracing to an output of any first flip-flop or an input pin, and said tracing includes forward tracing from an input pin or an output of any flip-flop found by backward tracing to an output pin or an input of any flip-flop and backward tracing from an output pin or input of any flip-flop found by forward tracing to an input pin or an output of any flip-flop;

inferring a plurality of input vectors for the inputs of each said combinational circuit based on an output vector of said each combinational circuit or said pass/fail information, said output vector being inferred based on said pass/fail information;

reducing said input vectors of said combinational circuit in number by simplification so as to form said output vector of preceding combinational circuit; and inferring a faulty position in one of said combinational circuits when no correct input vector is inferred based on said output vector of said one of said combinational circuits, said correct input vector coinciding with an expected input vector of inputs of said one of said combinational circuits.

2. A fault diagnosis method as defined in claim 1, further comprising the step of simulating said combinational circuit based on said input vector to obtain a value for a node inside said combinational circuit.

3. A fault diagnosis method as defined in claim 2, further comprising the step of detecting a failed path in said combinational circuit by comparing said value for each node and a corresponding expected value.

4. A fault diagnosis method as defined in claim 3, further comprising the step of calculating a frequency of appearances of said faulty position in the simulation using a plurality of inferred input vectors.

5. A fault diagnosis method as defined in claim 4, further comprising the step of comparing said frequency of appearances against a threshold.

6. A fault diagnosis method as defined in claim 1, further comprising the step of judging whether or not physical locations of a plurality of faulty positions coincide with one another.

7. A fault diagnosis method as defined in claim 1, wherein said reducing step uses a formula used for a Boolean algebra.

8. A fault diagnosis method as defined in claim 1, further comprising the step of assuming a number of said candidate faulty positions is less than three.

9. A fault diagnosis method as defined in claim 1, further comprising the step of judging a stacked failure, a short-circuit failure or an open-circuit failure based on the results of previous inference and the present inference succeeding the previous inference.

10. A fault diagnosis method as defined in claim 9, wherein said judging step judges a stacked failure when a single faulty location is inferred and an inferred value thereof is fixed with time, and a short-circuit failure or an open circuit failure when a single faulty location is inferred and an inferred value thereof is not fixed.

11. A fault diagnosis method as defined in claim 1, further comprising the step of judging whether or not a scanning flip-flop exists in the LSI.

12. A faulty diagnosis method as defined in claim 1, further comprising the steps of calculating delays of a plurality of failed paths and selecting a critical path among said failed paths based on said delays.

13. A faulty diagnosis method as defined in claim 1, further comprising the step of judging inputs of said combinational as failed inputs, normal inputs and inputs not affecting a value for a failed output or inferred failed output.

14. A faulty diagnosis method as defined in claim 13, further comprising the step of tracing from one of said failed inputs along a failed path in a preceding combinational circuit.

15. A faulty diagnosis method as defined in claim 1, further comprising the step of judging whether a clock pulse is applied to a flip-flop before tracing a path in preceding combinational circuit based on said input vectors.

16. A faulty diagnosis method as defined in claim 1, further comprising the steps of judging whether a failed input of said combinational circuit is connected to a data line, address line or control line of a memory cell in a memory cell array, and examining data line and address lines of said memory cell array or address lines and control lines depending on the results of said judgement.

17. A fault diagnosis method as defined in claim 1, wherein said reducing step reduces said input vectors in number corresponding to a number of said inputs of said combinational circuit at a maximum.

18. A fault diagnosis method as defined in claim 17, wherein said simplification is effected so as to cover all of said inferred input vectors by a total of respective failed values for said inferred input fail pins.

19. A fault diagnosis method as defined in claim 18, wherein said simplifying step comprises the step of counting a frequency of failed values for each failed input pin.

20. A fault diagnosis method as defined in claim 18, wherein each said simplified input vector corresponds to two or more of said inferred input vectors when respective failed values of said two or more of said inferred input vectors resides in one of common said inferred input vectors.

21. A fault diagnosis method as defined in claim 20, wherein said simplifying step comprises the step of counting a frequency of failed values for each failed input pin.

22. A fault diagnosis method as defined in claim 1, wherein one of said simplified input vectors corresponds to one of inferred failed input pins, said one of said simplified input vectors including codes 0/1/Y/Q/D corresponding to values for respective input pins of said combinational circuit, "0" corresponding to a case of expected value "0" and inferred value "0", "1" corresponding to a case of expected value "1" and inferred value "1", "Y" corresponding to a case of expected value "0" and inferred value "0", "Q" corresponding to a case of expected value "1" and inferred value "0", "D" corresponding to expected value "1" or "0" and inferred value "1" or "0" depending on conditions.

23. A fault diagnosis method as defined in claim 22, wherein a number of simplified input vectors of one of combinational circuits corresponds to a number of said inferred input fail pins at a maximum.

24. A fault diagnosis method as defined in claim 1, further comprising the step of inferring a faulty position in one of said combinational circuits when said tracing is stopped by inconsistency of an inferred value with an expected value.

25. A fault diagnosis method for a LSI comprising the steps of:

obtaining information of expected values for outputs of each flip-flop in the LSI based on each input vector of said each flip-flop, pass/fail information for each output pin in a test, and a netlist for the LSI;

consecutively extracting, based on said netlist, combinational circuits each having a plurality of inputs each connected to an input pin or an output of any flip-flop and a plurality of outputs each connected to an output pin or input of any flip-flop, the combinational circuit including nets and logic elements other than a flip-flop, wherein said tracing starts from a failed output pin by backward tracing to an output of any first flip-flop or an input pin, and said tracing includes forward tracing from an input pin or an output of any flip-flop found by backward tracing to an output pin or an input of any flip-flop and backward tracing from an output pin or input of any flip-flop found by forward tracing to an input pin or an output of any flip-flop;

inferring paths traced from said failed output in each said extracted combinational circuit as inferred failed paths and a primary candidate faulty positions from which at least one candidate faulty position is selected;

tracing a plurality of said inferred failed paths to draw an inferred failed route from said failed output to said candidate faulty position passing a plurality of said extracted combinational circuits;

calculating frequency for each candidate faulty position based on said failed output pins;

weighing said candidate faulty positions by said frequency; and selecting at least one of said candidate faulty positions having higher frequency than the others of said candidate faulty positions as an inferred faulty position.

26. The fault diagnosis method as defined in claim 25, further comprising the step of comparing said frequency against a threshold.

27. The fault diagnosis method as defined in claim 25, wherein said frequency is calculated as the number of said failed output pins from which said candidate faulty position is traced.

28. The fault diagnosis method as defined in claim 25, wherein said frequency is calculated as the number of said inferred failed routes.

29. The fault diagnosis method as defined in claim 25, further comprising the step of classifying said candidate faulty positions by examining logical values of said candidate faulty position.

30. The fault diagnosis method as defined in claim 29, wherein said classifying step comprises at least one of the steps including
(1) selecting one of said primary candidate faulty positions having a fixed logical value;
(2) selecting one of said primary candidate faulty positions having a logical value changing with time; and
(3) selecting a pair of said primary candidate faulty positions having co-related logical values, as said candidate faulty position.

31. The fault diagnosis method as defined in claim 25, wherein said primary candidate faulty position selecting step infers a bridge failure when two primary candidate faulty positions have failed logical values at the same time of inferring.

32. The fault diagnosis method as defined in claim 25, further comprising the step of dividing a path portion having a single input node and a single output node into a plurality of sub-paths, wherein said primary candidate faulty position selecting step includes the step of obtaining necessary conditions required for said failed route:
(1) infers a bridge failure if a pair of nodes inside said path portion have failed logical values at the same time (2) infers a bridge failure if said single input node has two separating branches and said output node has two coupling branches as viewed along said backward tracing; and
(3) infers no bridge failure if said single input node has three or more separating branches as viewed along said backward tracing.

33. The fault diagnosis method as defined in claim 32, wherein said frequency calculating step comprising the step of classifying said candidate faulty position into a plurality of failure modes.

34. The fault diagnosis method as defined in claim 33, further comprising the step of calculating a frequency for said candidate faulty position for each failure mode.

35. A fault diagnosis system comprising:

a netlist management section for storing a total netlist of a subject LSI and capable of registering a partial netlist of each partial circuit of said LSI, said netlist management section retrieving/deleting data stored therein based on a request from other sections;

an expected value management section for controlling expected data of input and output pins and any flip-flops in said LSI;

an inferred value management section for storing actual logical values and inferred logical values of said input and output pins and said flip-flops of said LSI;

a candidate faulty position management section for storing candidate faulty positions, inferred failed logical values and failure mode of said candidate faulty positions;

a combinational circuit extracting section for extracting combinational circuits in said LSI by tracing from failed outputs or inferred failed outputs of said LSI;

combinational circuit inferring section for inferring logical values of paths in said combinational circuit based on output vectors to infer failed paths;

a path selecting section for selecting an inferred failed paths based on failed outputs and output vectors of said combinational circuit;

a failed route selecting section for selecting a failed route from a failed output pin of said LSI to a candidate faulty position based on said inferred failed paths;

an inferred value judgement section for judging whether or not a logical value of said candidate faulty position is fixed;

a failure mode classifying section for classifying each said candidate faulty position into a plurality of failure mode;

a frequency-weighing section for weighing each said candidate faulty position based on a number of said failed outputs or a number of inferred failed routes by which said each candidate faulty position is traced; and a sequence controller for controlling sequence and timing of said sections.

36. The fault diagnosis system as defined in claim 35, wherein said netlist management section, said expected value management section, said candidate faulty position management section and said inferred value management section are implemented as servers, which register, retrieve, delete, add and modify their own data based on request from clients implementing said combinational circuit inferring section, said path selecting section, said failed route selecting section, said inferred value judgement section, said failure mode classifying section, said frequency-weighing section, and said sequence controller.

* * * * *